US012008460B2

(12) United States Patent
Yudanov et al.

(10) Patent No.: US 12,008,460 B2
(45) Date of Patent: Jun. 11, 2024

(54) PERFORMING PROCESSING-IN-MEMORY OPERATIONS RELATED TO PRE-SYNAPTIC SPIKE SIGNALS, AND RELATED METHODS AND SYSTEMS

(71) Applicant: Micron Technology, Inc., Boise, ID (US)

(72) Inventors: Dmitri Yudanov, Cordova, CA (US); Sean S. Eilert, Penryn, CA (US); Hernan A. Castro, Shingle Springs, CA (US); Ameen D. Akel, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 709 days.

(21) Appl. No.: 17/007,588

(22) Filed: Aug. 31, 2020

(65) Prior Publication Data

US 2021/0073623 A1    Mar. 11, 2021

Related U.S. Application Data

(60) Provisional application No. 62/896,267, filed on Sep. 5, 2019.

(51) Int. Cl.
*G06N 3/06* (2006.01)
*G06N 3/049* (2023.01)
(Continued)

(52) U.S. Cl.
CPC .............. *G06N 3/063* (2013.01); *G06N 3/049* (2013.01); *G11C 11/4063* (2013.01);
(Continued)

(58) Field of Classification Search
CPC .......... G06N 3/063; G06N 3/049; G06N 3/02; G06N 3/06; G06N 3/084; G06N 7/04;
(Continued)

(56) References Cited

U.S. PATENT DOCUMENTS 9,653,127 B1    5/2017 Mantegazza et al.
10,416,927 B2   9/2019 Lea et al.
(Continued)

FOREIGN PATENT DOCUMENTS

WO    2019/125421 A1    6/2019
WO    WO-2019125421 A1 * 6/2019 ............... G06K 9/00

OTHER PUBLICATIONS

Sparsh Mittal, "A Survey of ReRam-Based Architectures for Processing-in-Memory and Neural Networks", Apr. 30, 2018, Machine Learning and Knowledge Extraction, pp. 75-112. (Year: 2018).*
(Continued)

*Primary Examiner* — Paulinho E Smith
(74) *Attorney, Agent, or Firm* — TraskBritt

(57) ABSTRACT

Spiking events in a spiking neural network may be processed via a memory system. A memory system may store data corresponding to a group of destination neurons. The memory system may, at each time interval of a SNN, pass through data corresponding to a group of pre-synaptic spike events from respective source neurons. The data corresponding to the group of pre-synaptic spike events may be subsequently stored in the memory system.

22 Claims, 14 Drawing Sheets

(51) Int. Cl.
  G06N 3/063 (2023.01)
  G11C 11/4063 (2006.01)
  G11C 11/54 (2006.01)
  G06N 3/084 (2023.01)
  G06N 5/046 (2023.01)

(52) U.S. Cl.
  CPC .............. *G11C 11/54* (2013.01); *G06N 3/084* (2013.01); *G06N 5/046* (2013.01)

(58) Field of Classification Search
  CPC .... G06N 7/046; G06N 5/046; G11C 11/4063; G11C 11/54; G11C 14/0009; G11C 14/0045; G11C 2213/00; G11C 2213/70; G11C 2213/71; G11C 13/0002
  See application file for complete search history.

(56) References Cited

U.S. PATENT DOCUMENTS

| | | | |
|---|---|---|---|
| 10,521,714 | B2 | 12/2019 | Esser et al. |
| 2012/0036099 | A1* | 2/2012 | Venkatraman ......... G06N 3/049 706/27 |
| 2012/0173471 | A1 | 7/2012 | Ananthanarayanan et al. |
| 2014/0129498 | A1 | 5/2014 | Bichler et al. |
| 2015/0278685 | A1 | 10/2015 | Zheng et al. |
| 2016/0364644 | A1 | 12/2016 | Brothers et al. |
| 2017/0017879 | A1 | 1/2017 | Kataeva et al. |
| 2018/0082176 | A1 | 3/2018 | Wu et al. |
| 2018/0107922 | A1 | 4/2018 | Paul et al. |
| 2018/0174028 | A1 | 6/2018 | Lin et al. |
| 2018/0174040 | A1 | 6/2018 | Davies et al. |
| 2018/0174042 | A1 | 6/2018 | Srinivasa et al. |
| 2018/0225562 | A1 | 8/2018 | Van Der Made |
| 2018/0260696 | A1 | 9/2018 | Suda et al. |
| 2018/0322384 | A1 | 11/2018 | Augustine et al. |
| 2019/0005376 | A1* | 1/2019 | Akin ....................... G06N 20/00 |
| 2019/0303740 | A1 | 10/2019 | Arthur et al. |
| 2019/0385704 | A1 | 12/2019 | Oster |
| 2021/0004174 | A1* | 1/2021 | Boniardi ............... G06F 3/0604 |
| 2021/0072986 | A1* | 3/2021 | Yudanov ............... G06F 7/5443 |

OTHER PUBLICATIONS

Byung-Do Yang, "A Low-Power SRAM Using Bit-Line Charge-Recycling for Read and Write Operations", Oct. 2010, IEEE Journal of Solid-State Circuits, Vo. 45 No. 10, pp. 2173-2183 (Year: 2010).*

International Search Report for Application No. PCT/US2020/048822, dated Dec. 4, 2020, 3 pages.

Kornijcuk et al., "Pointer Based Routing Scheme for On-chip Learning in Neuromorphic Systems", 2018 International Joint Conference on Neural Networks (IJCNN), Jul. 13, 2018, sections 2-3.

Kornijcuk et al., "Reconfigurable Spike Routing Architectures for On-Chip Local Learning in Neuromorphic Systems", Advanced Materials Technologies—Advanced Intelligent Systems, vol. 4, No. 1, Oct. 15, 2018, pp. 2-4, 12: and figures 1c, 3a.

Written Opinion of the International Searching Authority for Application No. PCT/US2020/048822, dated Dec. 4, 2020, 5 pages.

Yudanov et al., U.S. Appl. No. 16/717,890, Nanowire Zero-Capacitor DRAM Transistors with and without Junctions90 titled Methods for Performing Processing-in-Memory Operations on Serially Allocated Data, and Related Memory Devices and Systems filed Dec. 17, 2019.

Yudanov et al., "GPU-Based Simulation Neural Networks with Real-Time Performance & High Accuracy", The 2010 International Joint Conference on Neural Networks (IJCNN), IEEE, Jul. 18, 2010, 8 pages.

European Extended Search Report and Opinion for European Application No. 20861906.4, dated Jan. 3, 2024, 9 pages.

Guo et al., "Unsupervised Learning on Resistive Memory Array Based Spiking Neural Networks", Frontiers in Neuroscience, vol. 13, Article 812, Aug. 2019, 16 pages.

* cited by examiner

_800_

```
At a first time quanta of a series of time quanta of a SNN: receive first pre-synaptic
spike events from respective source neurons of the SNN, wherein the first pre-
synaptic spike events comprises respective source neuron identifications
810
```

```
Filter a group of the first pre-synaptic spike events having source neuron
identifications at least partially matching destination synapse identifications
of destination neurons in a block of memory
820
```

```
Store the group of first pre-synaptic spike events in the block of memory
830
```

```
Assign a label to a pointer in a pointer table in the block of memory that points
to the group of first pre-synaptic spike events, wherein the label corresponds
with a time quanta of a series of time quanta of the SNN
840
```

_FIG. 8_

900

Store synaptic connections of a destination neuron at a first memory array, each of the synaptic connections include a delay value and an incoming neuron identification, wherein each of the synaptic connections are grouped together based on the delay value and wherein each of the delay values corresponds to a time quanta in a series of time quanta of a SNN
910

Store pre-synaptic spike events from respective source neurons at a second memory array, wherein each number of pre-synaptic spike events includes an incoming neuron identification, and the number of pre-synaptic spike events are grouped together by the time quanta in a series of time quanta of the SNN
920

Match the incoming neuron identifications of the synaptic connections of the destination neuron with the incoming neuron identification of the source neurons at a first time quanta
930

In response to the matching, generate an output signal, at the second memory array, corresponding to a bitmask of synaptic spike event
940

FIG. 9 ns and Systems

PERFORMING PROCESSING-IN-MEMORY OPERATIONS RELATED TO PRE-SYNAPTIC SPIKE SIGNALS, AND RELATED METHODS AND SYSTEMS

CROSS-REFERENCE TO RELATED APPLICATION

This application claims the benefit under 35 U.S.C. § 119(e) of U.S. Provisional Patent Application Ser. No. 62/896,267, filed Sep. 5, 2019, the disclosure of which is hereby incorporated herein in its entirety by this reference.

TECHNICAL FIELD

Embodiments of the disclosure relate to processing-in-memory and, more specifically, to performing processing-in-memory (PIM) operations related to spiking events of a spiking neural network (SNN). Yet more specifically, some embodiments relate to methods for performing PIM operations within a processing-in-memory capable memory device, and related memory devices, memory systems, and electronic systems.

BACKGROUND

Memory devices are typically provided as internal, semiconductor-based, integrated circuits in computers or other electronic systems. There are many different types of memory including volatile and non-volatile memory. Volatile memory, which may retrieve stored information after being power cycled, may include, among others, flash memory including NAND or NOR flash memories. Volatile memory may require power to maintain its data (e.g., host data, error data, etc.) and includes random access memory (RAM), dynamic random access memory (DRAM), static random access memory (SRAM), synchronous dynamic random access memory (SDRAM), content addressable memory (CAM), and thyristor random access memory (TRAM), among others.

Electronic systems often include a number of processing resources (e.g., one or more processors), which may retrieve and execute instructions and store the results of the executed instructions to a suitable location. A processor may include a number of functional units such as arithmetic logic unit (ALU) circuitry, floating point unit (FPU) circuitry, and a combinatorial logic block, for example, which may be used to execute instructions by performing an operation on data (e.g., one or more operands). As used herein, an operation may include, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in an electronic system may be involved in providing instructions to the functional unit circuitry for execution. The instructions may be executed, for instance, by a processing resource such as a controller and/or host processor. Data (e.g., the data on which the instructions may be executed) may be stored in a memory array that is accessible by the functional unit circuitry. The instructions and/or data may be retrieved from the memory array and sequenced and/or buffered before the functional unit circuitry begins to execute instructions on the data.

In many instances, processing resources (e.g., processor and associated functional unit circuitry) may be external to the memory array, and data is accessed via a bus between the processing resources and the memory array to execute a set of instructions. Processing performance may be improved in a processor-in-memory (PIM) device, in which a processor may be implemented internally and/or near to a memory (e.g., directly on a same chip as the memory array). A PIM device may save time and/or conserver power by reducing and eliminating external communications.

BRIEF DESCRIPTION OF THE DRAWINGS

FIG. 8 is a flowchart of an example method of processing-in-memory spiking events, in accordance with various embodiments of the present disclosure.

FIG. 9 is a flowchart of another example method of processing-in-memory spiking events, in accordance with various embodiments of the present disclosure.

DETAILED DESCRIPTION

Figure 1:
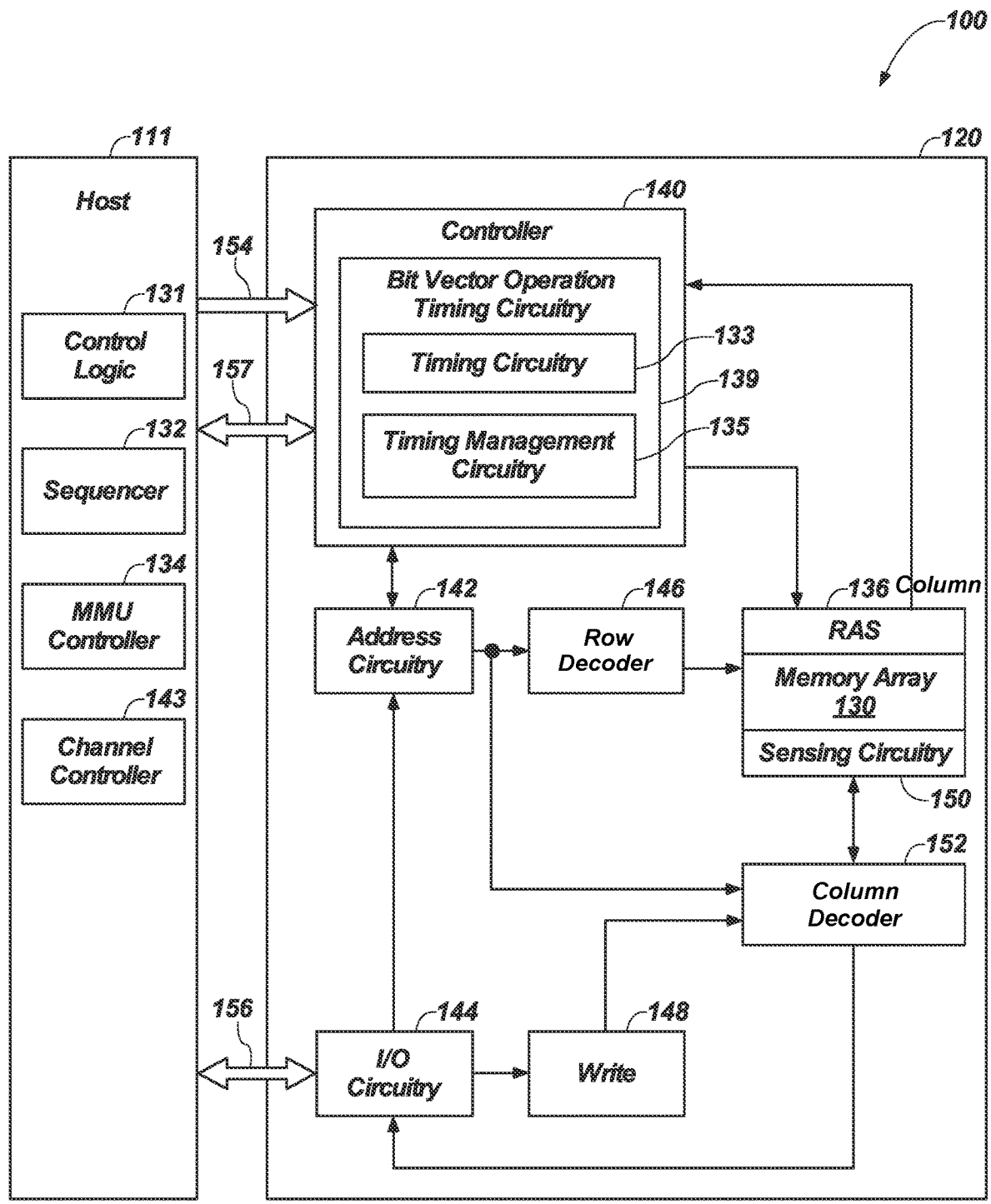
FIG. 1 is a block diagram of a system including a memory device, in accordance with a number of embodiments of the present disclosure.

Processing spiking events in a spiking neural network (SNN) is used in many applications, such as in machine learning, image processing, artificial intelligence, system modeling (e.g., electrical systems, mechanical systems, brain-computer interface, large-scale brain simulations, robotics, control systems, etc.), and many others. The operations to process spiking events (e.g., pre-synaptic events, synaptic events) may be relatively simple (e.g., filtering, matching, and accumulate). However, conventional computer-based computations may involve processor- and memory-intensive operations, including transferring large amounts of data between compute cores and memory arrays.

Various embodiments of the disclosure relate to processing-in-memory (PIM) operations, and more specifically to performing PIM operations to process spiking events in a SNN. In at least one embodiment, a memory system includes a block of memory. The memory is configured to store data corresponding to a group of destination neurons. The memory may include a spike signal filter configured to, at each time interval (also referred to herein as a "time quanta") in a series of time intervals of a SNN, pass through data corresponding to a group of pre-synaptic spike events from respective source neurons. The data corresponding to the group of pre-synaptic spike events may be subsequently stored in the block of memory. The block of memory is also configured to store a pointer table. The pointer table is configured to store a pointer to each of the groups of pre-synaptic spike events stored in the block of memory, and increment labels, corresponding to each pointer, at each time interval.

As used herein, a processing-in memory (PIM) capable device refers to a memory device capable of performing arithmetical and logical operations on data stored in an array of memory cells using a processing resource internal to the memory device (e.g., without transferring the data to an external processing resource such as a host processor). As an example, a PIM-capable device may include a memory array coupled to sensing circuitry comprising sensing components operable as 1-bit processing elements (e.g., to perform parallel processing on a per column basis) or multi-bit processing elements (e.g., to perform parallel processing on a per slice basis, wherein each slice (e.g., a slice of a row) comprises multiple columns). A PIM-capable device may also perform memory operations in addition to logical operations performed "in memory," which may be referred to as "bit vector operations." As an example, a PIM-capable device may include a dynamic random access memory (DRAM) array configured for memory operations including memory access operations such as reads (e.g., loads) and writes (e.g., stores), among other operations that do not involve operating on the data, as well as additional operations that do involve operating on the data. For example, a PIM-capable device may operate a DRAM array as a "normal" DRAM array and/or as a PIM DRAM array depending on a type of program being executed (e.g., by a host), which may include both memory operations and bit vector operations. For example, bit vector operations may include logical operations such as Boolean operations (e.g., AND, OR, XOR, etc.) and transfer operations such as shifting data values in the array and inverting data values, for example.

As used herein, a PIM operation may refer to various operations associated with performing in memory processing utilizing a PIM-capable device. An operation hierarchy can be used to define a PIM operation. For example, a first (e.g., lowest) level in the operation hierarchy can include bit vector operations (e.g., fundamental logical operations, which may be referred to as "primitive" operations). A next (e.g., middle) level in the hierarchy can include composite operations, which comprise multiple bit vector operations. For instance, composite operations can include mathematical operations such as adds, multiplies, etc., which can comprise a number of logical ANDS, ORs, XORs, shifts, etc. A third (e.g., highest) level in the hierarchy can include control flow operations (e.g., looping, branching, filtering, matching, etc.) associated with executing a program whose execution involves performing processing using a PIM-capable device.

As described in more detail herein, PIM operations may be executed by various components within a system comprising a PIM-capable device. For instance, a first PIM control component (e.g., control logic, which may be referred to as a "scalar unit"), which may be located on a host, may execute control flow operations and provide composite operations to a second PIM control component (e.g., a sequencer), which may also be located on the host or on the PIM-capable device. In a number of embodiments, the second control component may provide low level bit vector operations to a PIM control component located on the PIM-capable device (e.g., bit vector timing circuitry), which may execute the bit vector operations in memory and return results to the host. As described further herein, an interface used to transfer PIM operations between a PIM-capable device and the host may include a channel, which may include a bus separate from a typical memory interface, such as a DDR interface, used to transfer commands, addresses, and/or data. Also, in a number of embodiments, providing PIM control components on the host may provide benefits such as allowing a PIM program to use virtual addressing (e.g., by resolving virtual addresses on the host since the PIM-capable device may operate only on physical addresses).

FIG. 1 is a block diagram of a system 100 including a memory device 120, in accordance with a number of embodiments of the present disclosure. Memory device 120, which may also be referred to herein as a "PIM-capable device" or "PIM-capable memory device," may include any suitable memory device. For example, memory device 120 may include volatile memory (e.g., RAM, DRAM, etc.) and/or non-volatile memory (e.g., flash memory, a crosspoint memory device such as a 3D crosspoint memory device, etc.). Memory device 120 may include a memory array 130 (i.e., including memory cells) coupled to sensing circuitry, as described in more detail below. According to some embodiments, memory device 120 may include multiple memory arrays 130 organized in banks, ranks, decks, plains, blocks, segments or some other form.

System 100 further includes a host 111 coupled to memory device 120. Host 111 may include a host system such as a personal laptop computer, a desktop computer, a digital camera, a smart phone, or a memory card reader, among various other types of hosts. Host 111 may include a system motherboard and/or backplane and may include a number of processing resources (e.g., one or more processors, microprocessors, or some other type of controlling circuitry). System 100 may include separate integrated circuits or both host 111 and memory device 120 may be part of the same integrated circuit (e.g., on a same chip). System 100 may include, for instance, a server system and/or a high performance computing (HPC) system and/or a portion thereof.

Host 111 may include various components including PIM control components (e.g., control logic 131, a sequencer 132), a channel controller 143, and a memory management unit (MMU) controller 134. Control logic 131 may be configured to execute control flow commands associated with an executing PIM program and to provide composite commands to sequencer 132. Control logic 131 may be, or may include, a RISC type controller configured to generate and issue an extensible set of composite operation PIM commands that includes commands different from DDR commands sent to sequencer 132. In some embodiments, control logic 131 may be configured to issue composite operation commands to cause bit vector operations to be performed on memory device 120. In some embodiments, the composite operation commands may be transferred from control logic 131 to memory device 120 (e.g., via sequencer 132 and channel 157).

Control logic 131 may, in some embodiments, decode microcode instructions into function calls, which may be microcode function calls, associated with performing a bit vector operation, implemented by sequencer 132. The microcode function calls may be the operations that sequencer 132 receives and/or executes to cause memory device 120 to perform particular bit vector operations using the sensing circuitry, such as sensing circuitry 150.

As shown in FIG. 1, control logic 131 and MMU controller 134 are located on host 111, which may allow for control logic 131 and/or MMU controller 134 to access virtual addresses stored on host 111 and perform virtual to physical address resolution (e.g., translating a virtual address of an address space associated with an application running on the host 111 with actual physical address of the memory device 120) prior to transferring instructions to memory device 120. The translation may be performed at a host by looking up address translation tables stored in memory device 120 (e.g., page tables) or by performing the same on memory device 120. In some embodiments, control logic 131 and/or sequencer 132 are located in memory device 120, for instance in controller 140 or in row decoder 146. In other embodiments, control logic 131, sequencer 132, or MMU controller 134 may be distributed such that part of their functionality is located on host 111 and another part on memory device 120.

As used herein, a "bit vector" may refer to a physically contiguous number of bits, whether physically contiguous in rows (e.g., horizontally oriented) or columns (e.g., vertically oriented). A PIM-capable device may be configured to perform bit vector operations such as logical operations and/or transfer operations on a number of contiguous portions (e.g., "chunks") of virtual address space. For example, a chunk of virtual address space may have a bit length of 256 bits. A chunk may or may not be contiguous sequentially to other chunks in the virtual address space, however, it will be contiguous within a scope of a memory page. In disclosed embodiments, a PIM-capable device may be configured to perform the said operations in virtual address space after translation of virtual addresses of virtual pages to physical addresses of physical pages.

MMU controller 134, which may reside on host 111 (as shown in FIG. 1), may be responsible for performing the translation of virtual memory addresses (e.g., addresses associated with the host 111) to physical addresses (e.g., addresses associated with the memory device 120). MMU controller 134 may also perform memory protection operations, cache control, and/or bus arbitration operations.

Timing circuitry 133 may provide timing to coordinate performance of logical operations and may be responsible for providing conflict free access to arrays, such as memory array 130 in FIG. 1. In various embodiments, controller 140 and/or the timing management circuitry 135 may generate status information, which may be transferred to or from host 111, for example via channel 157. Channel 157 may be independent of (e.g., separate from) a double data rate (DDR) memory interface (e.g., control bus 154) that may be used to transfer (e.g., pass) DDR commands between host 111 and memory device 120. That is, in some embodiments, channel 157 may be used to transfer commands between a host 111 and a memory device 120, a memory access device, or another memory interface. Non-limiting examples of a memory interface include a double data rate (DDR) memory interface, a peripheral component interconnect express (PCIe) memory interface, a coherent accelerator processor interface (CAPI), compute express link (CXL), cache coherent interconnect for accelerators (CCIX), and combinations and subcombinations of the foregoing, without limitation.

As a non-limiting example, a DDR memory interface (e.g., control bus 154) may be used to transfer (e.g., pass) DDR commands between host 111 and memory device 120. That is, in some embodiments, channel 157 may be used to transfer commands to cause performance of bit vector operations from host 111 to memory device 120, while control bus 154 may be used to transfer DRAM commands (or commands of another type of memory interface) from host 111 to memory device 120. In some embodiments, the DRAM commands (or other types of commands) that are transferred via control bus 154 may be commands to control operation of DRAM (or commands to control other types of memory, memory access devices, or memory interfaces) such as DDR1 SDRAM, DDR2 SDRAM, DDR3 SDRAM, DDR4, DDR5 and other versions of a DDR type protocol, without limitation. In other embodiments, memory device 120 may signal to host about readiness of operations via channel 157. In some embodiments, channel 157 is combined with control bus 154 and/or data bus 156. Further, in some embodiments, host 111 may include multiple memory devices 120 with multiple channels and/or control buses.

In some embodiments, sequencer 132 may include a very large instruction word (VLIW) type controller configured to operate on logical operation commands and control logic 131 may be configured to issue the logical operation commands to sequencer 132 in response to a signal from a processing resource (not shown) of host 111. For example, sequencer 132 may be configured to sequence multiple logical operations such that composite operation commands may be issued by sequencer 132. Control logic 131 may, in some embodiments, be configured to generate an executable instruction such as a VLIW type instructions or an SMID type instructions. In an embodiment including a VLIW type instruction controller, control logic 131 may be configured to generate a VLIW as a bit vector operation command(s). The VLIW may comprise microcode instructions. Sequencer 132 may be, or may include, the VLIW type controller configured to decode the VLIW into a plurality of separate microcode instructions. For example, sequencer 132 may decode the VLIW into instructions to cause performance of composite operations (e.g., ADD, MULTIPLY, DOT PRODUCT, without limitation). In some embodiments, the composite operation commands may provide an entry point into a sequence of VLIW instructions to cause perform such composite operations. In an embodiment including an SMID type instruction controller, control logic 131 may be configured to generate a unit of data, such as a vector of data, without limitation, and sequencer 132 may cause execution of a single instruction in parallel on multiple data points identified in the unit of data.

Sequencer 132 may be coupled to memory device 120 and may pass commands to coordinate bit vector operations to memory device 120 via channel 157. Microcode instructions may be executable in sequence and/or in parallel by sequencer 132 itself and/or by other components in the memory device 120 (e.g., bit vector operation timing circuitry 139, timing circuitry 133, timing management circuitry 135, and/or sensing circuitry 150). Memory array 130 may include a DRAM array, SRAM array, STT RAM array, PCRAM array, TRAM array, RRAM array, NAND flash array, and/or NOR flash array, for instance. Memory array 130 may include memory cells arranged in rows coupled by access lines, which may be referred to herein as word lines or select lines, and columns coupled by sense lines, which may be referred to herein as data lines, digit lines, or bit lines. Although a single memory array is shown in FIG. 1, embodiments are not so limited. For instance, memory device 120 may include a number of memory arrays 130 (e.g., a number of banks of DRAM cells, NAND flash cells, etc.).

Memory device 120 includes address circuitry 142 to latch address signals for data provided over a data bus 156 (e.g., a data/address bus) through I/O circuitry 144. Status and/or exception information may be provided from controller 140 on memory device 120 to a channel controller 143, through an interface (e.g., a high speed interface (HSI)) including channel 157. Address signals are received through address circuitry 142 and decoded by a row decoder 146 and a column decoder 152 to access memory array 130. Data may be read from memory array 130 by sensing the state of memory cells on the digit lines using sensing circuitry 150. The state of memory cells may be sensed as, for example, voltage and/or current changes, magnetic state changes, resistivity, and quantum state, and so on, depending on the memory cell technology. Sensing circuitry 150 may read and latch a page (e.g., row) of data from memory array 130. I/O circuitry 144 may be used for bi-directional data communication with host 111 over data bus 156. Write circuitry 148 can be used to write data to memory array 130. In some embodiments, write circuitry 148 is combined with sensing circuitry 150. In other embodiments, sensing circuitry 150 can be a part of column decoder 152 and/or row decoder 146. In some embodiments, control bus 154 may serve as both a control and address bus for DRAM control and addressing (e.g., in accordance with a DDR protocol in which control bus 154 operates as a unidirectional data bus). Although shown as separate buses in FIG. 1, in some embodiments, control bus 154 and data bus 156 may not be separate buses. Controller 140 (e.g., memory controller) may decode signals provided by control bus 154 from host 111. These signals can include chip enable signals, write enable signals, and address latch signals that are used to control DRAM operations performed on memory array 130, including data read, data write, and data erase operations. In various embodiments, controller 140 may be responsible for executing instructions from host 111 and sequencing access to memory array 130. Controller 140 may include a state machine, sequencer, or some other type of controller and include hardware and/or firmware (e.g., microcode instructions) in the form of an application specific integrated circuit (ASIC). In a number of embodiments, controller 140 may include bit vector operation timing circuitry 139. Controller 140 may control, for example, sensing circuitry 150. For example, controller 140 may control generation of clock signals and application of the clock signals to compute components in association with performing bit vector operations.

As shown in FIG. 1, bit vector operation timing circuitry 139 may include timing circuitry 133 and timing management circuitry 135. Timing circuitry 133 may include a FIFO buffer to provide timing coordination with sensing circuitry 150 associated with memory array 130 of memory cells. In some embodiments, timing circuitry 133 may include a state machine, such as an atomic state machine.

Timing management circuitry 135 may be configured to coordinate timing of logical operations (e.g., a sequence of logical operations), associated with the bit vector operation, performed using a row address strobe (RAS)/column address strobe (CAS) component 136 associated with memory array 130. RAS component 136 may be configured to send and/or receive a signal (e.g., RAS/CAS signal) to or from memory array 130 to identify and/or select a row and/or column address of memory array 130. Memory device 120 may, in some embodiments, be configured to execute a DRAM operation such as a memory array access request, which may be issued by host 111 via control bus 154. In some embodiments, timing management circuitry 135 may be configured to execute instructions to control timing of performance of a bit vector operation.

In one or more embodiments, portions of controller 140, (e.g., bit vector operation timing circuitry 139, timing circuitry 133, and/or timing management circuitry 135), may include a reduced instruction set computer (RISC) type controller operating on, for example, 32- and/or 64-bit length instructions. In various embodiments, timing management circuitry 135 may be responsible for executing instructions received from timing circuitry 133 to cause performance of bit vector operations involving data values associated with sensing circuitry 150.

As described further below, in a number of embodiments, sensing circuitry 150 may include a plurality of sensing components, which can each include a sense amplifier and a compute component. The compute component may serve as an accumulator, and sensing circuitry 150 may be used to perform bit vector operations (e.g., on data associated with complementary digit lines). In a number of embodiments, sensing circuitry 150 may be used to perform bit vector operations using data stored in memory array 130 as inputs and/or store the results of the operations back to the memory array 130 without transferring data via a digit line address access (e.g., without firing a column decode signal). For instance, various operations (e.g., bit vector operations) may be performed using, and within, sensing circuitry 150 rather than (or in association with) being performed by processing resources external to sensing circuitry 150 (e.g., by a processing resource associated with host 111 and/or other processing circuitry, such as ALU circuitry, located on memory device 120 (e.g., on controller 140 or elsewhere)). In a number of embodiments, sensing circuitry 150 (e.g., the number of sensing components) may be used to execute bit vector operations in a SIMD (single instruction multiple data) manner with the sensing components serving as 1-bit processing elements on a per column basis. In embodiments in which sensing circuitry 150 executes bit vector operations, sensing circuitry 150 may serve as and/or be referred to as an "in memory processor." As described more fully below, in some embodiments, sensing circuitry 150 may include a sequencer (e.g., similar to sequencer 132). In other embodiments, neighboring sensing components may exchange data bits amongst each other, thus producing computation based on multiple data sources. In other embodiments, sensing components may produce different computation depending on their location within sensing circuitry 150, thus, providing computation in VLIW or SIMD manner. In embodiments in which sensing circuitry 150 executes bit vector operations, sensing circuitry 150 may serve as and/or be referred to as an "in memory processor." As described more fully below, in some embodiments, sensing circuitry 150 may include a sequencer (e.g., similar to sequencer 132).

In various approaches, data associated with an operand, for instance, may be read from memory via sensing circuitry and provided to external memory array ALU circuitry via I/O lines (e.g., via local I/O lines and/or global I/O lines). The external memory array ALU circuitry may include a number of registers and would perform bit vector operations using the operands, and the result may be transferred back to the array via the I/O lines. In other embodiments, sensing circuitry 150 is configured to perform bit vector operations on data stored in memory array 130 and store the result back to the memory array 130 without enabling an I/O line (e.g., a local I/O line) coupled to sensing circuitry 150.

In a number of embodiments, circuitry external to memory array 130 and sensing circuitry 150 may not be needed to perform operations as sensing circuitry 150 may perform the appropriate bit vector operations without the use of an external processing resource. Therefore, sensing circuitry 150 may be used to complement and/or to replace, at least to some extent, such an external processing resource (or at least the bandwidth consumption of such an external processing resource). However, in a number of embodiments, sensing circuitry 150 may be used to perform logical operations (e.g., to execute instructions) in addition to logical operations performed by an external processing resource (e.g., host 111). For instance, host 111 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., sensing circuitry 150) without enabling column decode lines of the array. Whether or not local I/O lines are used in association with performing logical operations via sensing circuitry 150, the local I/O line(s) may be enabled in order to transfer a result to a suitable location other than back to memory array 130 (e.g., to an external register).

Various embodiments of the disclosure relate to processing spiking events in a SNN, and more specifically to performing PIM spiking event operations. According to various embodiments described herein, in a SNN, pre-synaptic spike signals of source neurons are routed to a destination neuron by performing PIM operations. For example, a SNN is emulated, at least in part, by performing PIM operations on one or more resistive memory arrays. Additionally and more specifically, accordingly to various embodiments described herein, in a SNN, PIM operations are performed to, among other things, filter pre-synaptic events according to their appropriate destination, determine when pre-synaptic spike events are triggered, determine when pre-synaptic spike event become spike events, maintain neuron membrane potential, generate spike events, adjust synaptic weights, etc.

Figure 2:
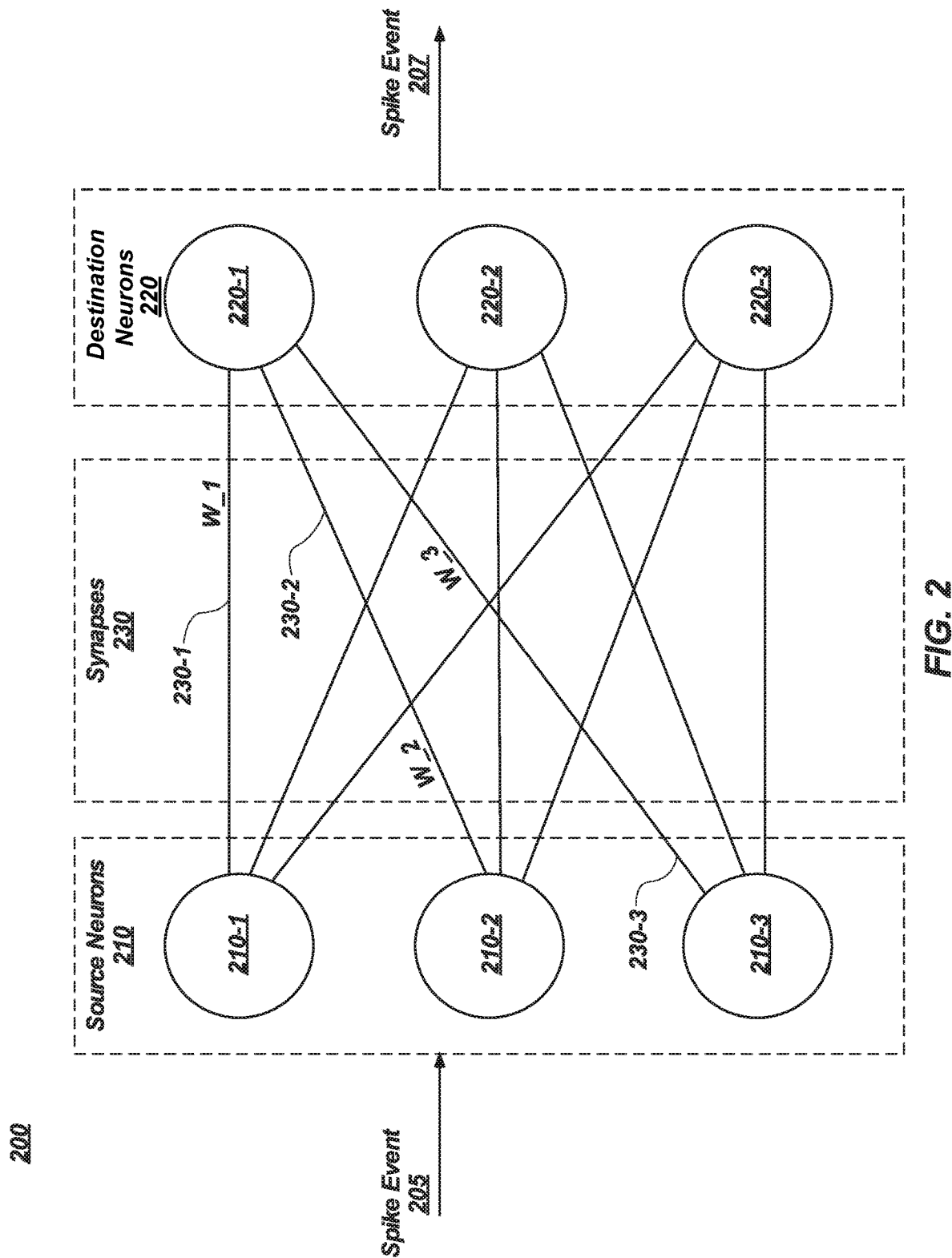
FIG. 2 illustrates a spiking neural network according to various embodiments of the present disclosure.

FIG. 2 depicts an embodiment of SNN 200 that includes multiple levels of neurons. SNN 200 includes a first level of neurons (e.g., source neurons 210 that includes source neuron 210-1, source neuron 210-2 and source neuron 210-3) connected to a second level of neurons (e.g., destination neurons 220 that includes destination neuron 220-1, destination neuron 220-2 and destination neuron 220-3) via synapses 230 (also referred to as synaptic connections). For the sake of brevity and clarity, only two levels of neurons are depicted in SNN 200. However, SNN 200 may include any number of levels of neurons. Additionally, each level of neurons can include any number of neurons. For example, source neurons in any level of SNN 200 can each include thousands of neurons, where each neuron in a first level (e.g., source neurons 210) has a synapses 230 (or synaptic connection) with each neuron in a next level (e.g., destination neurons 220). In such an example, synapse 230-1 connects source neuron 210-1 with destination neurons 220-1, synapse 230-2 connects source neuron 210-2 with destination neurons 220-1, and synapse 230-3 connects source neuron 210-3 with destination neurons 220-1. Likewise, source neuron 210-2 has synaptic connection with each destination neurons 220, and source neurons 210-3 has a synaptic connection with each of destination neurons 220.

Each of source neurons 210 may receive an input (e.g., spike event 205) generated by a number of neurons in a previous level or layer of SNN 200 (not shown). As such, source neurons 210 may be considered destination neurons while neurons in the previous level may be considered source neurons. The term "level" is used herein for ease of representation. A level does not have fixed boundaries, and a level can be any group of selected neurons, the neurons selected by certain criteria, such as neuron function, locality, proximity and so on, including random selection. Thus, neurons may form connections within levels. Thus, any neuron of a group of source neurons of any level can be also a destination neuron of any group of destination neurons of any other level. Similarly, any neuron of a group of destination neurons of any level can be also a source neuron of any group of source neurons of any other level. Spike event 205 may represent an input current to source neurons 210. This current may be accumulated on a neuron membrane of a neuron (e.g., source neuron 210) to charge a membrane potential. When the membrane potential reaches a threshold value, the neuron generates and fires an output spike to be transferred to the next level of neurons (e.g., destination neurons 220).

The transfer of spikes from one level of neurons (e.g., source neurons 210) to a next level of neurons (e.g., destination neurons 220) may be achieved through synapses 230 (or synaptic connections). Synapses 230 may receive output signals (e.g., spikes) from source neurons 210 and transmit the signals to destination neurons 220. For example, when source neuron 210-1 receives one or more spike events 205 and reaches a threshold potential value, source neuron 210-1 "spikes" and an output spike is transmitted to (1) destination neuron 220-1 via synapse 230-1, (2) destination neuron 220-2 via a synapse, and (3) destination neurons 220-3 via a synapse.

Additionally, synapses 230, upon receiving the output signals from source neurons 210, may scale the signals according to adjustable synaptic weights. As such, the synapses provide a combined scaled signals as an input signal(s) to the destination neurons. For example, when source neuron 210-1 receives one or more spike events 205 and reaches a threshold potential value, source neuron 210-1 "spikes" and an output spike is transmitted to (1) destination neuron 220-1 via synapse 230-1, (2) destination neuron 220-2 via a synapse, and (3) destination neurons 220-3 via a synapse. For example, a spike signal from source neuron 210-1 to destination neuron 220-1 along synapse 230-1 is scaled by synaptic weight, W_1 (and the spike signal from source neuron 210-1 to destination neurons 220-2 and 220-3 may be scaled by the same or other weights), a spike signal from source neuron 210-2 to destination neuron 220-1 along synapse 230-2 is scaled by synaptic weight, W_2 (and spike signal from neuron 210-2 to destination neurons 220-2 and 220-3 may be scaled by the same or other weights), and a spike signal from source neuron 210-3 to destination neuron 220-1 along synapse 230-3 is scaled by synaptic weight, W_3 (and the spike signal from neuron 210-3 to neurons 220-2 and 220-3 may be scaled by the same or other weights). Accordingly, destination neurons 220 may generate output spikes (e.g., spike event 207) based on the corresponding combined input signals. The output spikes (e.g., spike event 207) are then transmitted to another level or layer of neurons (not shown) using another network of synapses in SNN 200.

The bandwidth required to process spiking events in a SNN may be quite large. The following description provides an example of the bandwidth needed to process a SNN. In general, in an SNN, every 1 millisecond (ms), 3-5% of neurons generate a spike. In various embodiments, each spike event is represented by small data struct: source neuron ID, and spike time stamp (the spike time stamp is optional and may be inferred from SNN time intervals as shown further). On average each SNN neuron connects to about 1000s of other neurons. Spikes that neurons generate are delivered to all connections after some delay. At the time of delivery these spike events become synaptic events. For example, a spike event becomes a synaptic event when a source neuron ID matches a destination synapse ID, and spike time stamp generated by SNN system embodiment at a time of spike plus connection plus connection delay corresponds to current SNN system time stamp.

Additionally, delay values differ for each connection and are usually between 1 to 100 ms or 50 ms on average (floating point or integer). A spike time stamp is unique for each spike event. As a result, it may be desired to deliver spikes just in time when they are due at specific synapses. For a small SNN with 1 million (M) neurons (0.001% of human brain): 5% spiked×1M neurons×1000 connections per neuron×64 bytes (b) per synaptic event=400 MB/ms or 400 GB/s. That is, a computing system that emulates an SNN is required to have hardware and bandwidth to transmit 400 MB/ms (or 400 GB/s). In some conventional computing systems, processing resources (e.g., processor and associated functional unit circuitry) may not be able to transmit data at these requirements over a bus. Accordingly, there is a need for a computing system to process SNN events (e.g., pre-synaptic events, spiking events, etc.) that require a high data transmission bandwidth. As will be described in further detail below, the high bandwidth requirements may be sufficiently met by hierarchical routing and compact event storage on resistive memory arrays. For example, PIM operations implemented on resistive memory arrays may save time and/or conserve power by reducing and eliminating external communications. As will be described in further detail herein, SNNs (such as SNN 200 of FIG. 2) may be emulated, at least in part, by performing PIM operations on one or more resistive memory arrays (e.g., memory array 130 of FIG. 1).

Figure 3:
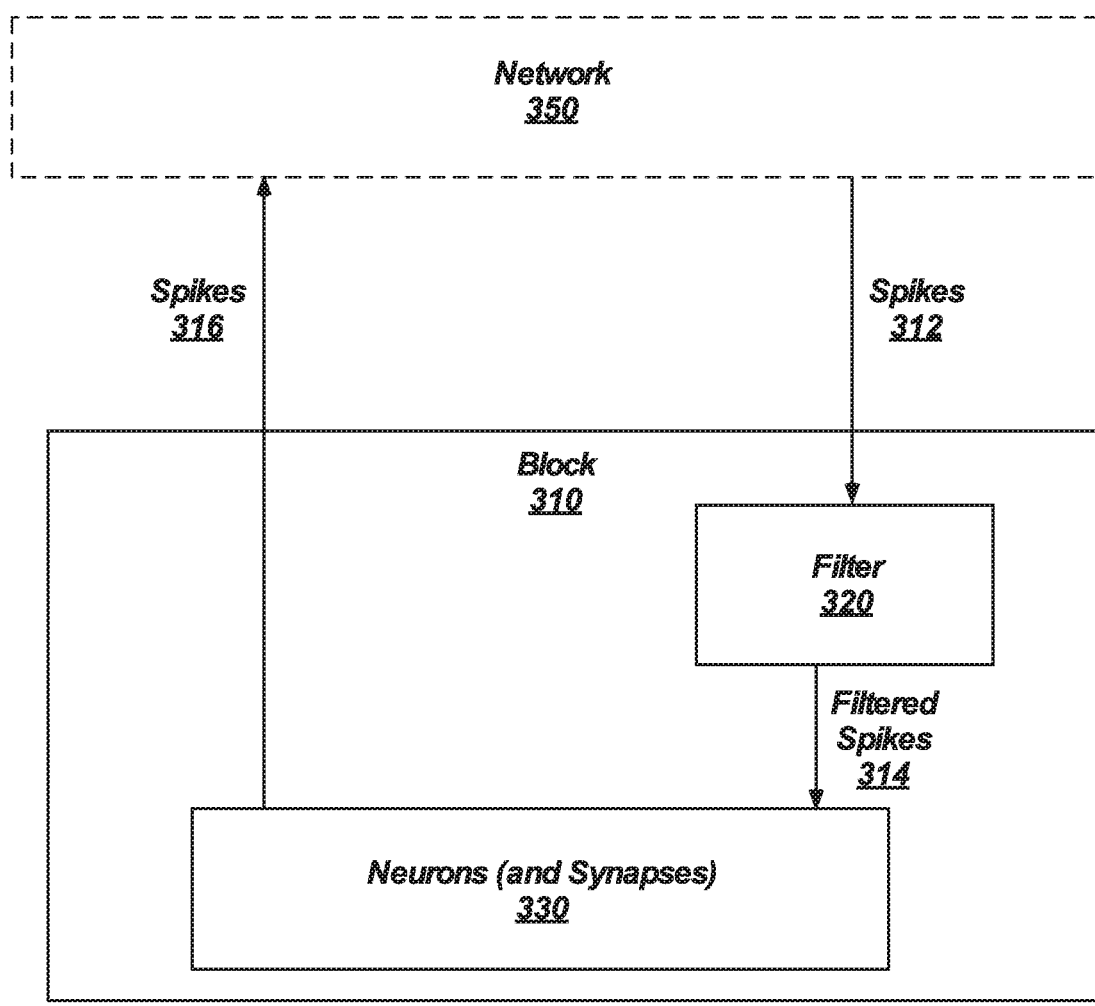
FIG. 3 illustrates a memory system for processing spiking events according to various embodiments of the present disclosure.

FIG. 3 depicts an embodiment of system 300 for data partitioning and routing of spike events. System 300 includes a number of memory blocks, such as memory block 310, and network 350. Memory block 310, in various embodiments, includes a resistive memory array. In general, a resistive memory array is a type of non-volatile random-access computer memory that comprises memory cells, which resistance (i.e., the amount of current flowing across a memory cell as a function voltage applied across a memory cell) can be changed. Such memory cells may be memory elements, PCM cells, 3D X-point, diode-like cells and even cells based on transistors, which threshold voltage can be adjusted, and therefore this adjustment may provide an ability to modulate current across a memory cells (e.g., Flash memory elements with floating gate transistors). Memory block 310, in various embodiments, includes a single memory die, a memory tile, or the like.

Memory block 310 includes a subset of neurons 330 in a SNN. Neurons 330 can be any subset of neurons in a SNN. It should be appreciated that memory block 310 includes both neurons and synapses between neurons (e.g., synapses 230). As such, neurons 330 may also include synapses associated with the neurons.

In an example, neurons 330 includes neurons in a particular layer or level of an SNN. In such an example, referring to FIG. 2, neurons 330 includes destination neurons 220. Other subsets of neurons, in an SNN, are stored in other blocks of memory (not shown) that are also coupled to network 350. As such, neurons and synapses of an SNN (e.g., SNN 200) are partitioned into blocks and these blocks are connected by network 350. In various embodiments, network 350 includes a ring or torus topology that can be digital or analog. It should be appreciated that the partitioning of neurons may include hierarchical block organization. For example, a first large block of memory is a collection of many smaller blocks of memory.

At certain time intervals (e.g., every 1 ms) a block of neurons generates spike events. For example, one or more of neurons 330 (e.g., destination neurons 220) generates spikes 316 (e.g., spike event 207) which is broadcasted to other neurons in other blocks (not shown) via network 350. At the same time (e.g., within the same interval or time period), spikes 312 from other blocks generated contemporaneously (e.g., within the same time interval or period) arrive at a number of blocks (e.g., every single block in system 300). For example, spikes 312 from other blocks (e.g., source neurons 210 stored in other blocks) are broadcast to neurons 330 in memory block 310. In some examples, an interval, period, or duration of time may be referred to as a time quantum, and an interval, intervals of time, and series of time intervals may be referred to as series of time quanta.

In various embodiments, for 1M neurons and 64b spike event datum, the broadcast of spikes over network 350 may be estimated at, for example: 5% of the neurons spiked×1M neurons×64b per synaptic event=400 KB/ms or 400 MB/s. Additionally, in some embodiments, system 300 may need 40 MB of storage to retain synaptic events locally (e.g., 400 KB×100 ms max delay). The broadcast of spike events over network 350 can be implemented either via shared memory (e.g., only 400 KB is needed for every 1M neurons) or via special bus or hybrid approach (combination of both).

In some embodiments, one or more blocks (e.g., each block) of memory in system 300 includes a filter. For example, memory block 310 includes filter 320. Filter 320 is configured to pass spikes that have destinations in memory block 310. More specifically, for example, at each time quanta (e.g., every 1 ms), filter 320 filters spikes 312 and passes through filtered spikes 314 that have a destination in memory block 310.

In various embodiments, filter 320 may filter spikes 312 based, at least in part on, neuron IDs. For example, spikes 312 include a neuron ID (e.g., ID of a source neuron) and neurons 330 include synaptic IDs (i.e., IDs of synapses that matches the source neurons IDs that these synapses are connected to). As such, filter 320 passes through filtered spikes 314 that have a neuron ID that matches synaptic IDs of neurons 330. For 1M neurons, and 32b neuron ID, each local filter for each block (e.g., filter 320 in memory block 310) may perform partial address match at the speed of, for example, 200 KB/ms or 200 MB/s at every block (i.e., 5% spiked×1M neurons×32b per neuron ID=200 KB/ms or 200 MB/s).

In various embodiments, matching or filtering functionality, alternative to filter 320, may include an address scheme with predetermined algorithmic allocation. For example, allocating target neurons such that a block ID matches some part of source neuron IDs. This may not be always possible due to unique topologies. In some embodiments, a hybrid method, including a combination of filter and address schemes, can be used. The same architecture (blocks organized on a bus such as a ring) can be used for other neural models: e.g., deep neural network (DNN), artificial neural network (ANN), long short-term memory (LSTM), where each block stores sets of neural net layers in sequence such that subsequent layers feed data into the next ones. As a result, blocks work in a daisy-chain manner. For example, each block receives data from the preceding block and pushes data to the bus for a subsequent block. Additionally, instead of spikes, it can be any data that is specific to the neural model used. Recursion of neural net is possible within a block since it would benefit from low-latency local communication.

Figure 4:
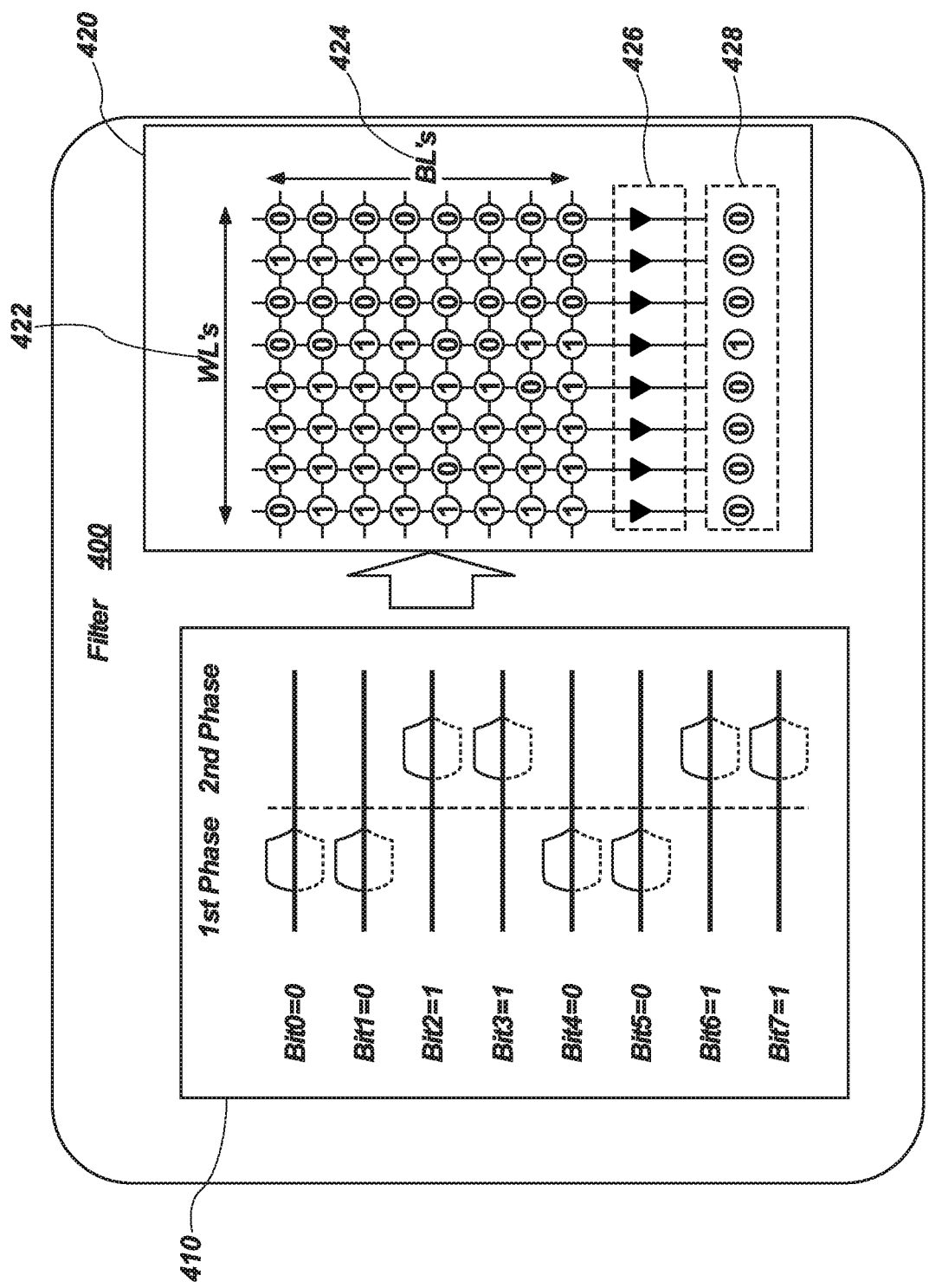
FIG. 4 illustrates a filter configured to filter spiking events according to various embodiments of the present disclosure.

FIG. 4 depicts an embodiment of filter 400. Filter 400, in one embodiment, is filter 320 (as shown in FIG. 3). Filter 400 includes a resistive memory array 420, and is configured to receive spike events (e.g., spikes 312 shown in FIG. 3) from neurons in other blocks (e.g., from source neurons 210 (see FIG. 2) stored in another block). For example, the spike events include a spiked neuron identification 410, such as an identification of a source neuron in source neurons 210. Spiked neuron identification 410, in various embodiments, may include an N-bit number (e.g., an 8-bit number such as 00110011).

Resistive memory array 420 includes a number of word lines 422 and bit lines 424. At each intersection of word lines and bit lines of resistive memory array 420 is a resistive memory element (e.g., memory element, PCM element, MTX or the like). Each bit line, in resistive memory array 420, stores the bits of a destination synapse identification. For example, as illustrated in FIG. 4, a first bit line stores destination synapse identification (e.g., 01111111) along respective memory elements, a second bit line stores destination synapse identification (e.g., 111101111) along respective memory elements, and so on. Referring to FIG. 3, the destination synapse identifications stored in resistive memory array 420 may include the synapse identifications of neurons 330. Each synapse of a particular destination neuron can be stored on the same bit line (assuming that a bit line is much longer than depicted on FIG. 4), or the synapses of a particular destination neuron can be stored on several bit lines.

Spiked neuron ID 410 is transmitted on word lines 422. For example, Bit0 ("0"), of spiked neuron ID 410, is transmitted onto a first word line. Bit1 ("0"), of spiked neuron ID 410, is transmitted on a second word line. Bit2 ("1"), of spiked neuron ID 410, is transmitted on a third word line and so on. In various embodiments, spiked neuron IDs, input into word lines 422, are grouped into positive polarity and negative polarity forward propagation phases. As an example, the input of spiked neuron ID 410 into word lines 422 can be done in two phases. For example, a first phase of bits are transmitted on respective word lines. Upon transmission of the first phase, then a second phase of bits are transmitted on respective word lines.

Upon transmission of spiked neuron ID 410 along word lines 422, an output of respective sense amplifiers 426 indicates whether there is a match between spiked neuron ID 410 and destination neuron IDs stored along the bit lines 424. In one embodiment, a partial match is determined after a first phase of bits are transmitted on respective word lines. Alternatively, a full match is determined after the first and second phase of bits are transmitted on word lines 422. More than two phases may be needed if the memory elements are capable of storing multiple bits, such as for example, Flash memory elements including QLC, MLC, Flash memory cells, and the like.

In various embodiments, a determination of a mismatch is based on detection of a snapback event. Alternatively, a determination of a match is based on no detections of a snapback event. Detection of snapback in the first phase may be used to abort the second phase. A snapback event may result in a sudden conductance, under certain conditions. An occurrence of a snapback event tends to significantly affect a current-voltage behavior of a memory cell. As such, a sense circuit, for example, may be provided that is responsive to a snapback event occurrence in a memory cell. The sense circuit may generate one or more feedback signals that initiate a change in an electric potential being applied to a memory cell.

Table 1 depicts the determination of a match or mismatch based on detection of snapback events.

TABLE 1

| Input State | Memory State | Result | |
|---|---|---|---|
| 0 | 0 | No Snapback | Match |
| 0 | 1 | Snapback | Mismatch |
| 1 | 0 | Snapback | Mismatch |
| 1 | 1 | No snapback | Match |

The input state refers to the value of a bit of spiked neuron ID 410. For example, the input state of Bit0 is "0," the input state of Bit1 is "1" and so on. Likewise, the memory state refers to the value of the bits in the memory elements along a bit line. For example, referring to the fifth bit line (from the left), the destination neuron ID is 00110011. As such, a memory state of the first bit is "0," a memory state of the second bit is "0," a memory state of the third bit is "1" and so on.

It is noted that both bit line and word line selection direction may change in each phase. Additionally, unselected bit lines and word lines remain at inhibit level. The input pattern affects both the word line and bit line signals.

An indication of a match is output 428 of "1" (e.g., the fifth bit line from the left) generated by a sense amplifier corresponding to the bit line. Output 428 is a bitmask of the matched destination synapse ID of a certain destination neuron. Multiple synapses may have the same IDs due to the same source neuron targeting multiple destination neurons.

Figure 5:
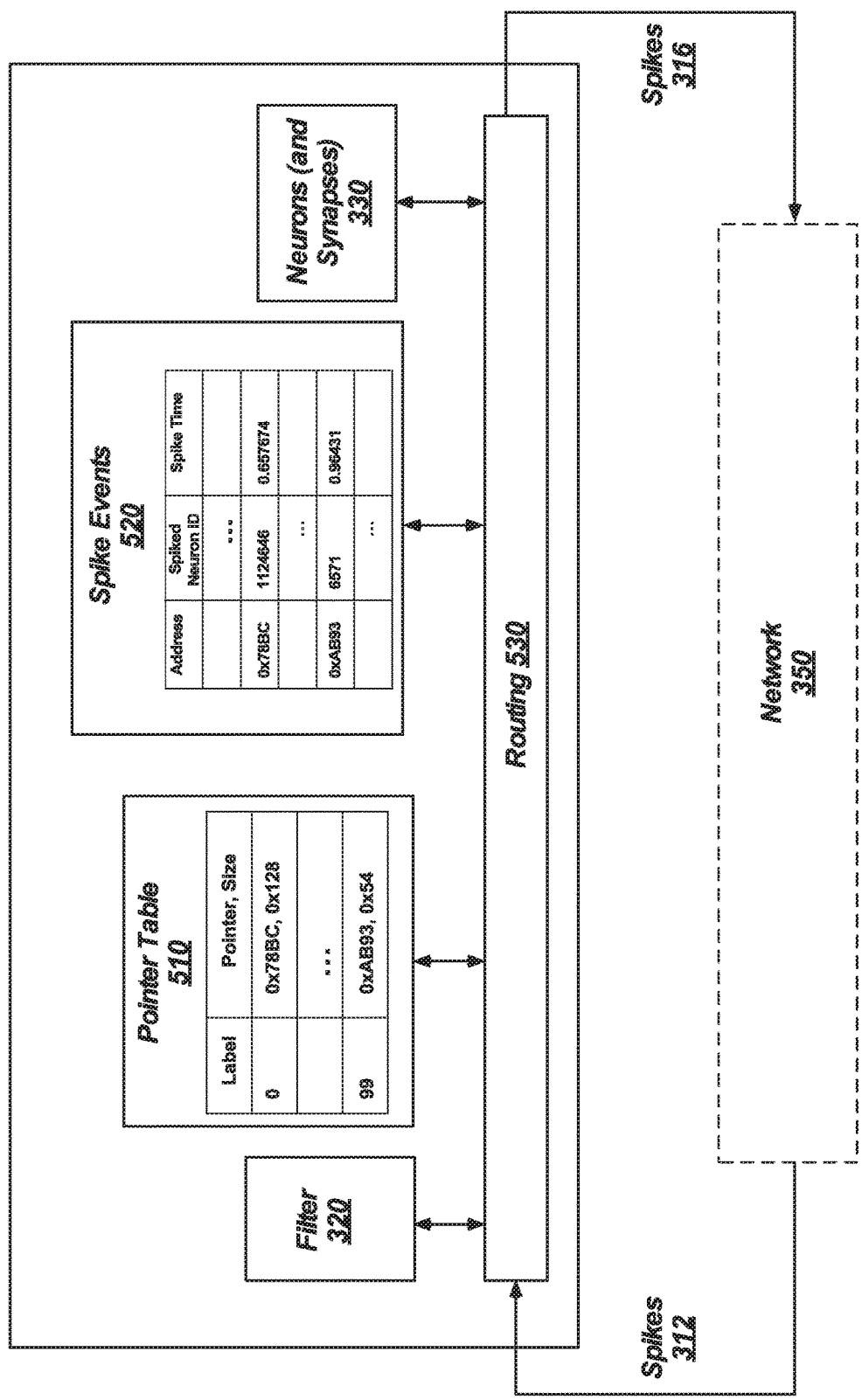
FIG. 5 illustrates a memory system, including a pointer table, for processing spiking events according to various embodiments of the present disclosure.

FIG. 5 depicts an embodiment of system 500. System 500, in one embodiment, is similar to system 300. For example, system 500 includes memory block 310, filter 320, neurons 330 and network 350. Also, filter 320 is configured to receive incoming spikes 312 from network 350, and outgoing spikes 316 (from neurons 330) are transmitted to network 350. In various embodiments, transmission of data within memory block 310 is via routing element 530 (e.g., data bus).

Spike events 520 may include spike events that are filtered by filter 320. In one embodiment, spike events 520 are filtered spike events 314 (as described with respect to at least FIG. 3). For example, spike events 520 are a subset of spikes 312 that have a destination in memory block 310 and pass through filter 320. Spike events 520 are stored in memory block 310 (upon passing through filter 320). In various embodiments, each spike event in spike events 520 includes a memory address, spiked neuron ID and spike time.

Memory block 310 includes pointer table 510 configured to store labels for spike events 520 that pass through filter 320 and are subsequently stored in memory block 310. For example, pointer table 510 includes labels for pointers of various groups of spike events that have passed through filter 320. In various embodiments, every time quanta (e.g., every 1 ms), a group of spike events 520 pass through filter 320 and are stored in memory block 310 in designated memory array(s). The group is assigned a label "0," in pointer table 510, indicating that it is the most recent spike events that have passed through filter 320 (at the most recent time quanta). The labels of other previously filtered groups are then incremented by 1. There are as many groups as time quanta in the maximum possible delay between a pair of a neurons (e.g., between a source neuron and a destination neuron). For example, given the maximum delay of 100 ms and time quanta 1 ms, there are 100 groups and associated labels. The label that is incremented to 100 becomes "0," and previously stored spike events are overwritten with the group of spike events (or simply spikes) that just arrived (most recent time quanta).

The maximum delay may be more or less than 100 ms. For example, spike-timing-dependent plasticity (STDP) may require more groups than just the maximum delay measured in terms of time quants (e.g., 100 groups in our case given maximum delay 100 ms and a single time interval 1 ms), which will be described in further detail below. In general, STDP is a biological process that adjusts the strength of connections (i.e., synapses) between neurons in the brain. The process adjusts the connection strengths based on the relative timing of a particular neuron's output and input action potentials (or spikes).

In one embodiment, spike time of the spike events is optional data to reduce time quantization for SNN subsections requiring precise timing. The time of a spike is between 0 and 1 (precise value within the time quanta) since the coarse-grain time is implied by the time interval/quanta and associated label. As a result, spike events 520 (and pointer table 510) are a compact representation of all pre-synaptic spike events bucketized by time quanta.

Figure 6:
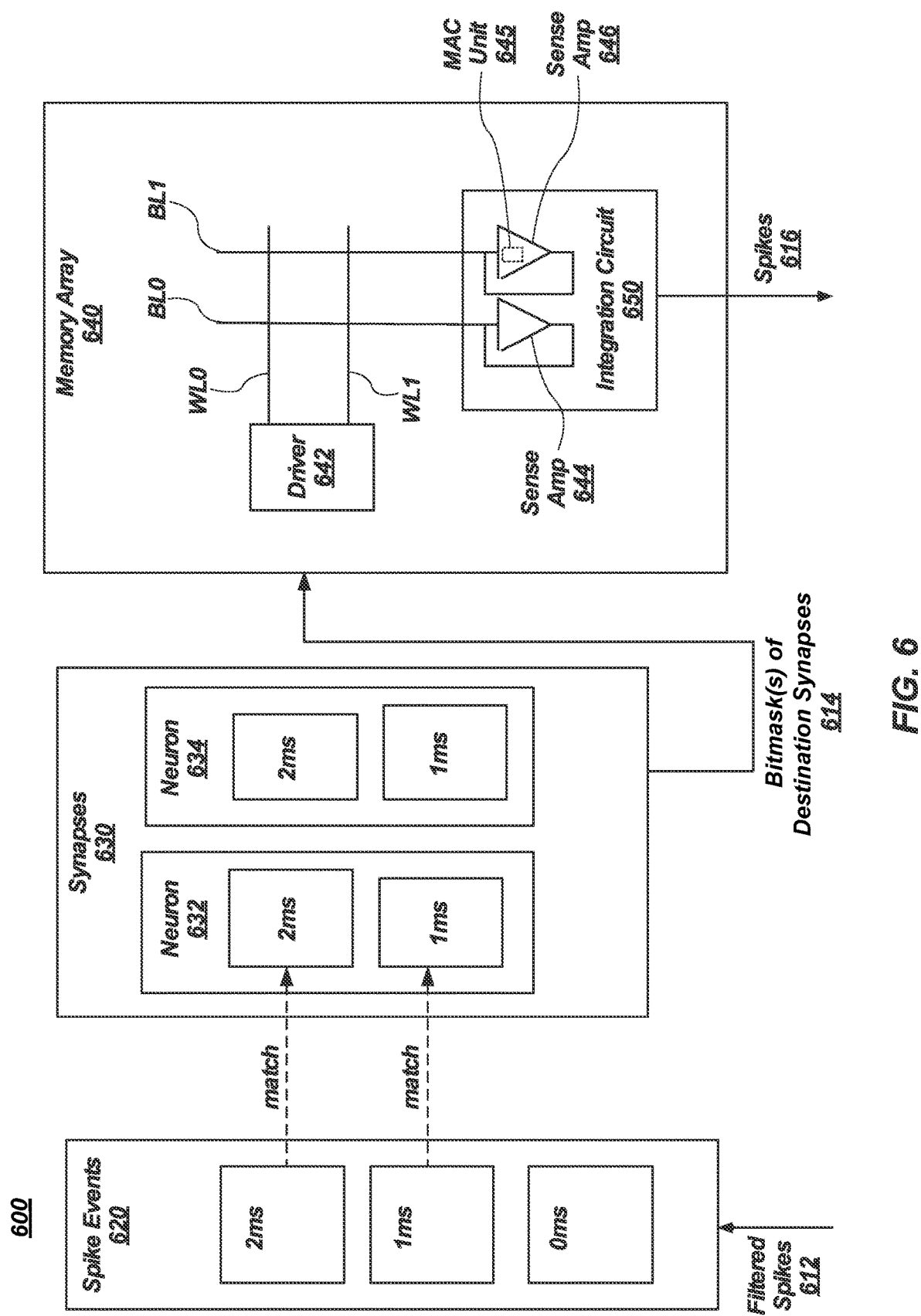
FIG. 6 illustrates a memory system for processing spiking events according to various embodiments of the present disclosure.

FIG. 6 depicts an embodiment of system 600 configured to translate pre-synaptic spike events to synaptic events. In particular, system 600 is configured to translate pre-synaptic spike events within a block of memory (e.g., memory block 310).

System 600 includes spike events 620 that are stored in a memory array of a block of memory. Spike events 620 (e.g., filtered spikes 314/612, spike events 520), in various embodiments, are pre-synaptic spike events, for example, from source neurons. For example, referring to FIG. 2, spike events 620 are pre-synaptic spike events from source neurons 210.

Synapses 630 (e.g., synapses 230) may receive output signals (e.g., spikes) from source neurons and transmit the signals to destination neurons. Synapses 630 are stored in a memory array in a block of memory such that synapses of each neuron are stored in predetermined possibly contiguous area. Synapses also may be stored in a memory array separate and distinct from a memory array that stores spike events 620 (and different from memory array 640).

Each neuron (e.g., a destination neuron) has pre-synaptic (incoming) connections. In various embodiments, a connection (e.g., synapse) includes the following information: a pre-synaptic neuron ID, a precise delay value (optional), and a connection weight.

Additionally, each connection has a delay including a delay value of some range: e.g., between 1 ms and 100 ms. The delay value can be quantized in increments of time quanta (e.g., 1 ms, 2 ms, 3 ms and so on) or it can be precise (e.g., 1.23523 ms). Synaptic connections of each neuron (specifically pre-synaptic neuron IDs, i.e., the IDs of source neurons) stored or allocated in buckets in the increments of 1 time quanta according to the quantized part of the delay: e.g., a bucket of connections which all have a delay of 1 ms, a bucket of connections which all have a delay of 2 ms and so on. The precise delay value may be used to reduce quantization, but is optional. The precise delay value is an addition to quantized delay: e.g., 2 ms (implied from bucket number)+0.34234 ms=2.34234 ms, where 2.34234 ms is the precise value. The precise delay value may be needed for some SNN sections requiring high accuracy. Depending on embodiment this may be a floating point or integer or some other custom format.

Synapses 630 are grouped by a number of neurons where each synaptic connection of the neuron is further grouped into buckets of quanta. For example, synaptic connections of neuron 632 (e.g., destination neuron) are separated by the value of their delay into a number of time quanta, such as, 1 ms time interval corresponding to 1-2 ms delay, 2 ms time corresponding to 2-3 ms delay and so on. Similarly, synaptic connections of neuron 634 (e.g., destination neuron) are separated into a number of time interval, such as 1 ms time interval corresponding to 1-2 ms delay, 2 ms time interval corresponding to 2-3 ms delay and so on. Further, groups of synapses corresponding to the same time interval from different neurons may be stored or allocated along the same word lines in the memory array section. It should be appreciated that synaptic connections can be separated into any number of time interval (e.g., 1 ms to 50 ms, at 1 ms time interval). Additionally, synapses 630 includes two neurons 632 and 634, however, it should be appreciated that synapses 630 can include any number of neurons (e.g., destination neurons).

At each time quanta, pointers of spike events 620 are incremented as previously described (e.g., 0 ms bucket is incremented to a 1 ms bucket, 1 ms bucket is incremented to a 2 ms bucket and so on).

Also, at each time quanta, spiked neuron IDs in every bucket of spike events 620 are matched with pre-synaptic neuron IDs in the corresponding synaptic bucket (e.g., a 1 ms spike bucket is matched with a 1 ms synaptic bucket, a 2 ms spike bucket is matched with a 2 ms synaptic bucket and so on). In particular, at each time quanta, it may be determined whether a spike neuron ID in a bucket (e.g., 2 ms bucket) in spike events 620 matches a pre-synaptic neuron ID in a corresponding bucket in synapses 630. For example, a matching function is implemented that determines whether a spike neuron ID in the 2 ms bucket of spike events 620 matches a pre-synaptic neuron ID in the 2 ms bucket of neuron 632 and neuron 634. In various embodiments, the matching function is similar to the filtering implemented by filter 320 and/or filter 400, as previously described. For example, word line drivers may drive the word lines with signals corresponding to bits of pre-synaptic neuron IDs (see FIG. 4) and sense amplifiers may determine a match or mismatch on the bit lines.

A match indicates that the spike event is due to arrive at that particular time quanta and for that particular synaptic connection. For example, a spike event in a time quanta of 2 ms is matched with a pre-synaptic IDs in time quanta 2 ms. Similarly, a spike event in time quanta of 1 ms is matched with a presynaptic IDs in time quanta 1 ms, and so on. In various embodiments, many synaptic events are generated every time quanta for each neurons.

In various embodiments, the match function is parallel. For example, each synaptic bucket can be in a different memory array and the matching function can determine matches in parallel. In various embodiments, neurons can be distributed among many subarrays and so on. In various embodiments, pre-synaptic neuron IDs from many neurons can be allocated along word lines such that IDs belonging to the same delay bucket from many neurons are tested for a match in parallel. This may result in parallel search operations. Alternatively, matching can be done in a serial manner. For example, the matching function can be performed one bucket at the time in a single array, as long as the buckets are generated before the real time quanta expires. Many pipelined and multiplexed variants of this method are possible.

In response to a match generated by the matching function, at each time quanta, a bitmask of the synaptic events are generated. For example, the matching function is implemented similar to filter 400 in FIG. 4. The output of a match includes a bitmask. Referring again to FIG. 6, the output of a match of the matching function is matched synaptic IDs corresponding to destination synapses 614 (e.g., a bitmask).

In some embodiments, a bitmask can be merged for different neurons. However, this may be done at the expense of space efficiency. For example, the more common connections across the group of neurons considered for merging the smaller the common bitmask. In one example (i.e., no common pre-synaptic neurons in a time quanta), the common bitmask is substantially increased by the number of neurons in the group. In another example (i.e., all pre-synaptic neurons in a time quanta are common), the common bitmask is the same for all. In some embodiments, bitmasks are specific for each neuron. In some embodiments, on average 5% of synaptic connections get synaptic events each time quanta. For example, for 1000 incoming connections this results in 50 synaptic events per time quanta. Hence, the size of bitmask is sparse (~50 set bits in 1000). The bitmask may also be compressed.

In some embodiments, the matching functionality may be avoided. For example, the matching functionality may be avoided if the network connectivity is patterned and can be described algorithmically in a compact way (e.g., 3-bit number to 8-bit 1-hot at the expense of array space). Hybrid methods of matching may also be implemented (e.g., hierarchical routing filters and matching function, event address and matching function, etc.).

Memory array 640, in various embodiments, facilitates in the integration of the presynaptic events according to the bitmask. Memory array 640, in various embodiments, is separate and distinct from a memory array for storing spike events 620 and a memory array for storing synapses 630.

Memory array 640 includes a number of word lines (e.g., WL0 and WL1) and a number of bit lines (e.g., BL0 and BL1). A memory element (or resistive device) is at the intersection of each word line and bit line. In various embodiments, memory elements are utilized to store a weight of a synaptic connection. For example, the resistance or conductance of a memory element is adjusted to correspond to weight of a synaptic connection. A weight of a synaptic connection may be stored in one or more memory elements on a single bit line (or may be stored on multiple bit lines).

Driver 642 may drive signals (e.g., voltage signal or current signal) corresponding to matched synapses (e.g., bitmask) on one or more word lines. Sense amplifiers (e.g., sense amplifiers 644 and 646) at each respective bit line may generate an output voltage based on current output from the corresponding memory element. Integration circuit 650 (that includes sense amplifiers) may integrate the output of the sense amplifiers. Upon a threshold potential value of a neuron being met, spikes 616 may be generated. Accordingly, memory array 640, at least in part, emulates spiking events in a SNN. For example, (1) signals driven by driver 642 emulates pre-synaptic events, (2) word lines, bit lines and memory elements emulates synapses and corresponding weights, and (3) sense amplifiers emulate neurons.

Integration of synaptic events may include various implementations depending on the data representation, such as (1) a digital representation of synaptic weights or (2) analog or mixed-signal representation of synaptic weights. In one embodiment, if synaptic weights are digital (floating point or integer) then the computation is the dot product of the synaptic conductance equation for the "set" positions of the bitmask. For example, the computation (or integration) is based on a constant synaptic current multiplied by synaptic weights. In various embodiments, the integration is performed by sense amplifiers (e.g., sense amplifiers 644 and 646) that include a built-in multiply-accumulate (MAC) unit (e.g., MAC unit 645). The sense amplifiers, in various embodiments, provide a function for neuron membrane equation.

Additionally, synaptic weights may be stored digitally in bit-serial or bit-parallel fashion on some section of memory array 640. In this implementation, if time-quantization effects are not desirable, a sense amplifier may compute integration at exact time spikes using optional data, such as, time stamp supplied with each pre-synaptic spike event and precise delay. This optional data may result in the synaptic event to jump to the next bucket (but no further than that).

In the analog or mixed-signal implementation, the synaptic weights are stored in a different (or same) memory array. Each weight can be represented by one or more resistive memory cells. Bitmasks are presented in sequence. For example, driver 642 drives the bitmasks in sequence. For each cycle of this sequence, relevant bit lines(s) are enabled.

The size of the sequence depends on how many neurons have common connections. For example, if each of the neurons are common, then one sequence is presented for all bit lines (or data lines) in one cycle. In various embodiments, if optional data is provided (e.g., synaptic current for each word line, exact synaptic event time and the like) then each word line is driven according to the synaptic current strength and at the prescribed exact time value.

In some embodiments, signals driven on word lines can be encoded in various ways: pulses, frequencies, amplitudes (currents and voltages), shapes (e.g., saw tooth, ramp up-down), spikes, and so on. As stated above, sense amplifiers represent neuronal function. For example, sense amplifiers perform current integration on bit lines and solve and keep membrane potential dynamics, and detect when target neuron spikes (e.g., spikes 616). For better parallelism, neurons and associated bit lines can be split into multiple groups and multiplexed with a shared word line driver.

It should be appreciated that storing synaptic weights can also be done in the same array where matching occurs. For example, pre-synaptic neuron IDs are intermixed with weights. In such an example, the memory array will be performing dual functions: in a first set of cycles it will generate synaptic masks, and in the second set of cycles it will perform integration by feeding back the synaptic mask to itself (word lines) but targeting different bit lines (the ones that store the weight info). Those sets of cycles can be time-multiplexed and interleaved for better efficiency.

Figure 7:
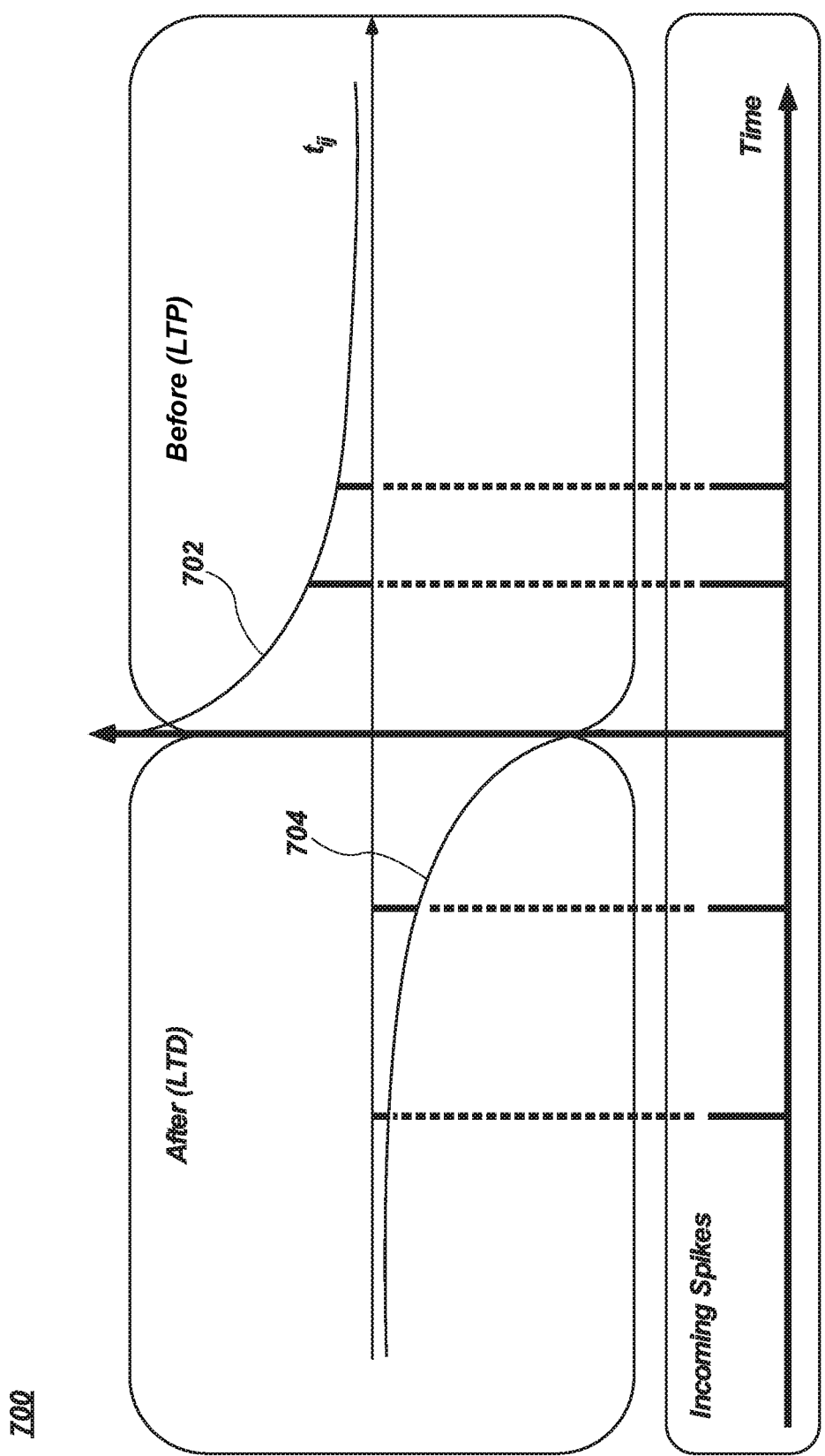
FIG. 7 illustrates a graph of a spike-timing-dependent plasticity (STDP) rule in a spiking neural network (SNN) according to various embodiments of the present disclosure.

FIG. 7 depicts an example graph of STDP results in synapse weighting. The y-axis indicates synaptic weight (e.g., change of conductance) and the x-axis indicates time.

The vertical line (between LTD and LTP) indicates a time which a post spike (e.g., a spike produced by a destination neuron) occurs. For a condition when a pre-synaptic spike arrived to its target synapse before a post-synaptic neuron generates a spike, the corresponding synaptic weight is increased, as illustrated in graph portion 702. This weight increase can be referred to as Long-Term Potentiation (LTP) of the synapse. It can be observed from the graph portion 702 that the amount of LTP may decrease roughly exponentially as a function of difference between pre-synaptic and post-synaptic spike times. In contrast, for a condition when a pre-synaptic spike arrived to its target synapse after a post-synaptic neuron generates a spike, the corresponding synaptic weight is decreased, as illustrated in graph portion 704. This weight decrease can be referred to as Long-Term Depression (LTD). It can be observed from the graph portion 704 that the amount of LTD may decrease roughly exponentially as a function of difference between pre-synaptic and post-synaptic spike times. As illustrated in FIG. 7, the synaptic weight-training curve may be asymmetrical. The LTP weight increment represented by portion 702 may be larger for short inter-spike intervals, but may decay faster than the LTD weight intervals.

In various embodiments, for post-spike synaptic events arrived within the LTD window, the post-synaptic neuron spike time is known. Accordingly, the adjustment of synaptic conductance is readily determined based on the known post-synaptic neuron spike time. In various embodiments, for pre-spike synaptic events within the LTP window, the adjustment of synaptic conductance is a challenge because: (1) post-synaptic neuron spike time is unknown; (2) every time quanta can bring new pre-synaptic events, which may disturb membrane potential and impact spike time of the post-synaptic neuron (for excitatory synapses their pre-synaptic events facilitate post-synaptic neuron spike generation, for inhibitory synapses their pre-synaptic events delay post-synaptic neuron spike generation), and (3) time quanta is on the order of 1 ms, whereas LTP window spans about 50 ms. Accordingly, the post-synaptic spike time is indeterministic until the target neuron actually spikes in the current time quanta.

Biology resolves this issue at the intra-cellular level with neuromodulators, "second messengers" and receptors by opening "eligibility window" at every single synapse. This window decays in time in proportion to STDP rule: i.e., during first few microseconds the synapse is highly susceptible to a change should the target neuron spike and its potential wave back-propagates to the synapse. However, the actual synaptic conductance does not change without this back-propagated potential wave. Should another pre-synaptic event arrive before post-synaptic neuron spike it will add-on to the already opened "eligibility window."

In a computer-emulated or -simulated network, in various embodiments, to resolve the above stated issue, all or the most recent pre-synaptic events (i.e., their time stamps) for the time length of LTP window are stored, and then, once a post-synaptic neuron generates a spike, these events are replayed and synaptic conductance values are adjusted accordingly. In another embodiment, the above stated issue is resolved by implementing "eligibility window" features in the memory cells of a memory array.

Referring again to FIG. 6, a feedback path from the sense amplifiers is provided to respective bit lines. In one embodiment, the feedback path provides for a depression, according to the STDP rule, to resolve the issue of post-spike arriving pre-synaptic events.

FIG. 8 is a flowchart of a method 800 of assigning a label to a pointer that points to pre-synaptic spike events, in accordance with various embodiments of the disclosure. Method 800 may be arranged in accordance with at least one embodiment described in the present disclosure. Method 800 may be performed, in some embodiments, by a device or system, such as system 100 of FIG. 1, system 300 of FIG. 3, system 500 of FIG. 5, and/or system 600 of FIG. 6, or another device or system. Although illustrated as discrete blocks, various blocks may be divided into additional blocks, combined into fewer blocks, or eliminated, depending on the desired implementation.

At block 810 of method 800, at a first time quanta of a series of time quanta of a SNN, first pre-synaptic spike events are received from respective source neurons of the SNN. The first pre-synaptic spike events comprises respective source neuron identifications. For example, referring to at least FIG. 3, at a first time quanta (e.g., 1 ms), spikes 312 are received from source neurons (e.g., source neurons 210) of a SNN. In one embodiment, a pre-synaptic spike from each neuron includes a source neuron ID, such as an ID of source neuron 210-1, an ID of source neuron 210-2 and so on.

At block 820, a group of the first pre-synaptic spike events having source neuron identifications at least partially matching destination synapse identifications of destination neurons in a block of memory are filtered. For example, filter 320 determines whether source neuron IDs in spikes 312 matches, at least in part, destination synapse IDs of neurons 330 (e.g., IDs of destination neurons 220). Upon determination of a match, filter 320 passes filtered spikes 314 into memory block 310.

At block 830, the group of first pre-synaptic spike events are stored in the block of memory. Upon determination of filtered spikes 314, filtered spikes 314 are stored in memory block 310, for example, in a resistive memory array of memory block 310. For example, referring to FIG. 5, spike events 520 (e.g., filtered spikes 314) are stored in memory block 310.

At block 840, a label is assigned to a pointer in a pointer table in the block of memory that points to the group of first pre-synaptic spike events. The label corresponds with a time quanta of a series of time quanta of the SNN. For example, still referring to FIG. 5, pointer table 510 includes labels associated with pointers of spike events 520.

Modifications, additions, or omissions may be made to method 800 without departing from the scope of the present disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, at each successive time quanta, the labels in pointer table 510 are incremented to a successive time quanta.

FIG. 9 is a flowchart of a method 900 of generating a bitmask of a matching pre-synaptic spike events with synaptic connections, in accordance with various embodiments of the disclosure. Method 900 may be arranged in accordance with at least one embodiment described in the present disclosure. Method 900 may be performed, in some embodiments, by a device or system, such as system 100 of FIG. 1, system 300 of FIG. 3, system 500 of FIG. 5, and/or system 600 of FIG. 6, or another device or system. Although illustrated as discrete blocks, various blocks may be divided into additional blocks, combined into fewer blocks, or eliminated, depending on the desired implementation.

At block 910 of method 900, synaptic connections (i.e., synapses and their associated variables or values) of a destination neuron are stored at a first memory array, each of the pre-synaptic connections include a delay value and an incoming neuron identification. Each of the synaptic connections are grouped together based on the delay value and wherein each of the delay values corresponds to a time quanta in a series of time quanta of a SNN. For example, synapses 630 are stored in a memory array. Synapses of neurons 632 and 634 are grouped in buckets of time quanta (e.g., 1 ms bucket, 2 ms bucket and so on). Each of the synapses of the neurons include an identification.

At block 920, pre-synaptic spike events from respective source neurons are stored at a second memory array. Each number of pre-synaptic spike events includes an incoming neuron identification, and the number of pre-synaptic spike events are grouped together by the time quanta in a series of time quanta of the SNN. For example, referring to FIG. 6, spike events 620 are stored in buckets of time quanta (e.g., 0 ms bucket, 1 ms bucket, 2 ms bucket and so on). Each of spike events 620 includes a time delay (e.g., corresponding time quanta) and an incoming neuron ID (e.g., source neuron ID).

At block 930, the incoming neuron identifications of the synaptic connections of the destination neuron are matched with the incoming neuron identification of the source neurons at a first time quanta. For example, spike events 620 of source neurons (having source neuron IDs) are matched with destination neuron IDs of synapses 630. This matching feature may be implemented by a filter similar to filter 320 (of filter 400).

At block 940, in response to the matching, an output signal is generated, at the second memory array, corresponding to a bitmask of pre-synaptic spike event. For example, a bitmask of matched IDs of source neurons with IDs of destination synapses 614 are generated in response to the matching. In such an example, destination synapses 614 are then sent to memory array 640 for driving on word lines via driver 642.

Modifications, additions, or omissions may be made to method 900 without departing from the scope of the present disclosure. For example, the operations of method 900 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 10:
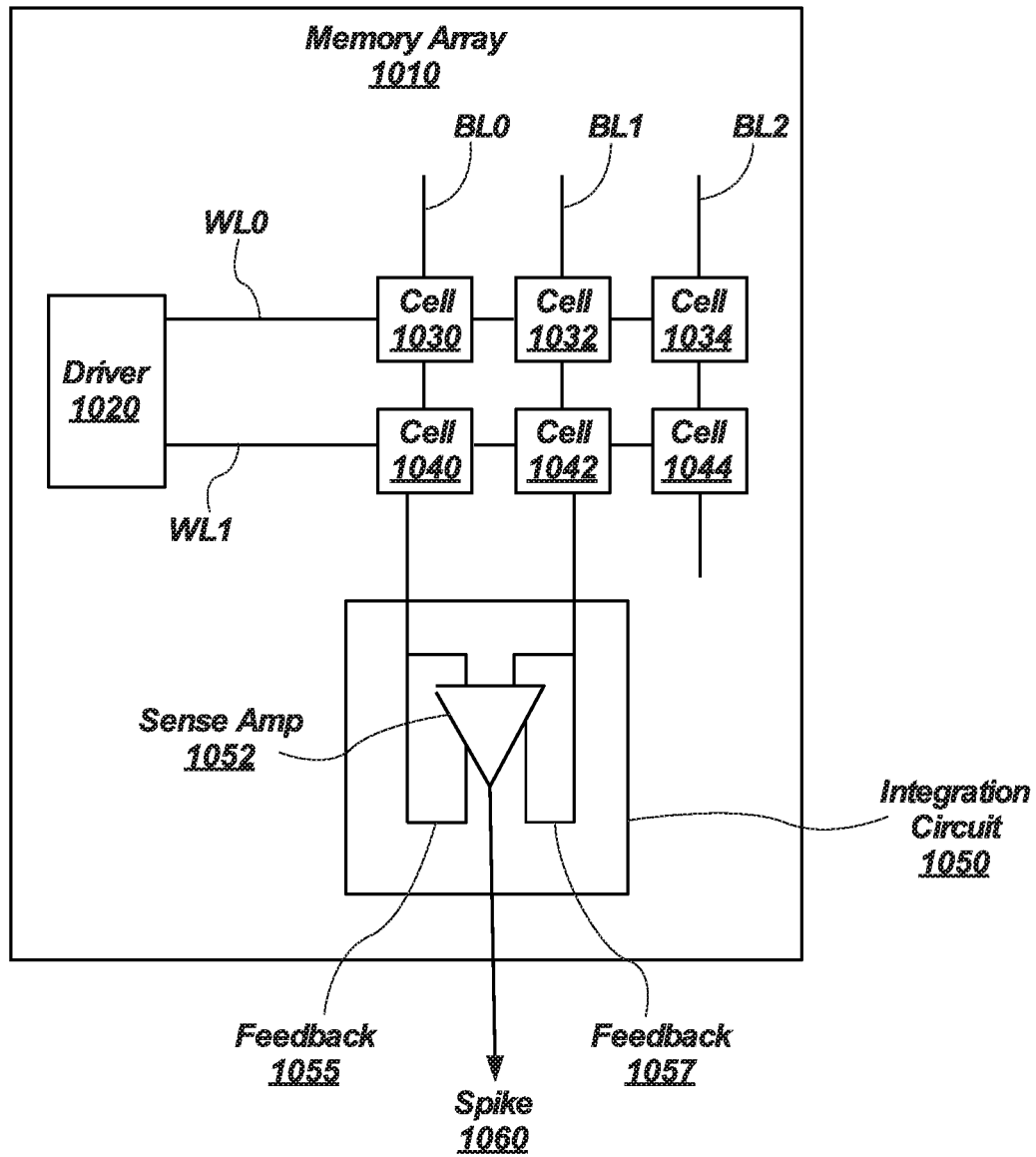
FIG. 10 illustrates a memory system for processing spiking events according to various embodiments of the present disclosure.

FIG. 10 shows an embodiment of system 1000 configured to generate synaptic events based, at least in part, on pre-synaptic spike events. In particular, system 1000 is configured to generate spike events within memory (e.g., memory array 1010).

In at least one embodiment, system 1000 generates spike events in accordance with the STDP rule as described with respect to FIG. 7. As described above, in view of the STDP rule, for post-spike synaptic events that arrive within the LTD window, the post-synaptic neuron spike time is known. Accordingly, the adjustment of synaptic conductance is readily determined based on the known post-synaptic neuron spike time. However, for pre-spike synaptic events within the LTP window, the post-synaptic spike time is indeterministic until the target neuron actually spikes in the current time quanta.

In various embodiments described herein, to resolve the above stated issue, pre-synaptic events received in the LTP window are stored, and then, once a post-synaptic neuron generates a spike, the pre-synaptic events are replayed and synaptic conductance values are adjusted accordingly.

System 1000 includes memory array 1010. Memory array 1010, in at least one embodiment, is similar to memory array 640, as described above. Memory array 1010 includes a number of word lines (e.g., WL0, WL1 and so on) and a number of bit lines (e.g., BL0, BL1, BL2 and so on). A memory cell is disposed at an intersection of each word line and bit line. For example, memory array 1010 includes memory cells 1030, 1032 and 1034 along word line, WL0 (at the intersection of BL0, BL1 and BL2, respectively), and memory cells 1040, 1042 and 1044 along word line, WL1 (at the intersection of BL0, BL1 and BL2, respectively). A memory cell, in various embodiments, includes a memory element. In various embodiments, memory cells are utilized to store a weight of a synaptic connection. For example, the resistance or conductance of a memory cell is adjusted to correspond to weight of a synaptic connection. A weight of a synaptic connection may be stored in one or more memory cells on a single bit line (or may be stored on multiple bit lines).

Driver 1020 may drive signals (e.g., voltage signal or current signal) corresponding to matched neurons (e.g., bitmask) on one or more word lines. One or more sense amplifiers (e.g., sense amplifier 1052) coupled to one or more bit lines may generate an output voltage based on a current output from the corresponding memory cell.

Integration circuit 1050 (that includes the one or more sense amplifiers) may integrate the output of sense amplifier 1052. Upon a threshold potential value of a neuron being met, a spike 1060 may be generated. Accordingly, system 1000, at least in part, emulates spiking events in a SNN. For example, (1) signals driven by a driver emulates pre-synaptic events, (2) memory cells, at least in part, emulate synapses and corresponding synaptic weights, and (3) integration circuit 1050 (that includes a sense amplifier) emulates one or more neurons. For example, integration circuit 1050 and/or sense amplifier 1052 may emulate a neuron in a SNN. As such, sense amplifier 1052 and integration circuit 1050 may be described herein as a "neuron," "neuron circuitry," or simply "circuitry."

The following description is directed to managing post-spike arriving pre-synaptic events. A post-spike arriving pre-synaptic event is when a pre-synaptic signal arrives at a destination synapse subsequent to a destination neuron generating a spike. In view of the STDP rule, as described above, the synaptic conductance (or synaptic weight) is adjusted (e.g., depressed) according to the LTD window.

Memory array 1010 includes feedback paths from integration circuit 1050 back to the bit lines coupled to integration circuit 1050. For example, sense amplifier 1052 is coupled to feedback 1055 to bit line, BL0, and coupled to feedback 1057 to bit line, BL1.

Providing a feedback path from integration circuit 1050 (or neuron circuitry) back to respective bit lines resolves the issue of post-spike arriving pre-synaptic events. Per the LTD window of the STDP rule, synapses of those events should be depressed. As such, the feedback paths provide a decaying bias of correct potential. In one embodiment, the decaying bias is applied to each memory cell on the bit line (e.g., globally applied to each cell). For example, a decaying bias signal is applied to BL0 from feedback 1055. Accordingly, the decaying bias is applied to memory cell 1030 and memory cell 1040 on BL0. Likewise, for example, a decaying bias signal is applied to BL1 from feedback 1057. Accordingly, the decaying bias is applied to memory cell 1032 and memory cell 1042 on BL1. The decaying bias may be differential in order to operate sense amplifier 1052, which also may be differential.

In various embodiments, a feedback signal (or decaying bias) is generated by integration circuit 1050 (or neuron circuitry) in response to a pre-synaptic event driven on a bit line in the memory array. Additionally, in various embodiments, integration circuit 1050 (or neuron circuitry) receives an output signal from the memory array that is indicative of a pre-synaptic signal received by the memory array.

If any pre-synaptic events arrive during this decaying bias (in the LTD window), cell conductance values, corresponding to the pre-synaptic events, are adjusted according to the decaying bias at the instant they arrive. A decaying bias, applied to a bit line, may be encoded by varying the bit line feedback potential or current in a number ways, such as, but not limited to, pulses, frequencies, amplitudes (currents and voltages), shapes (e.g., saw tooth, ramp up-down), spikes, and so on. The pre-synaptic signals driven on a word lines by driver 1020 (that emulates pre-synaptic events) may also be encoded by varying the feedback potential or current. As a result of an interaction between an encoded bias and encoded pre-synaptic signals (driven by driver 1020), a memory cell conductance is adjusted according to LTD rule, and at substantially the same time sense amplifier 1052 receives synaptic currents according to adjusted conductance. The synaptic currents may be integrated by integration circuit 1050 (that includes the one or more sense amplifiers), which may integrate the output of sense amplifier 1052. Upon a threshold potential value of a neuron being met, an output spike 1060 may be generated.

In various embodiments, memory array 1010 enables integrating pre-synaptic currents in a subthreshold domain without memory cell snapback. As described above, a snapback event may result in a sudden conductance in a memory cell. An occurrence of a snapback event tends to significantly affect a current-voltage behavior of the memory cell. Since memory array 1010 enables operation in the subthreshold domain, the power spent on current integration on a bit line may be very low.

In various embodiments, memory array 1010 enables a threshold delay effect. The threshold delay effect is a bias (e.g., a single pulse or multiple pulses) applied to a memory cell that changes the effective threshold (and current-voltage (I-V) curve) of the memory cell without inducing a snapback. Additionally, an effect of the bias disappears after some time. Thus, instead of applying a globally decaying feedback bias to a bit line, a threshold modulating bias pulse may be applied to a bit line immediately post-spike. As a result, a threshold for each cell on the bit line is increased or reduced (depending on implementation) in an individual manner. In other words, a cell decaying LTD window (in the form of drifting I-V curve) for each memory cell is unique due to uniqueness of each memory cell (i.e., every cell is slightly different from other cells).

Figure 11:
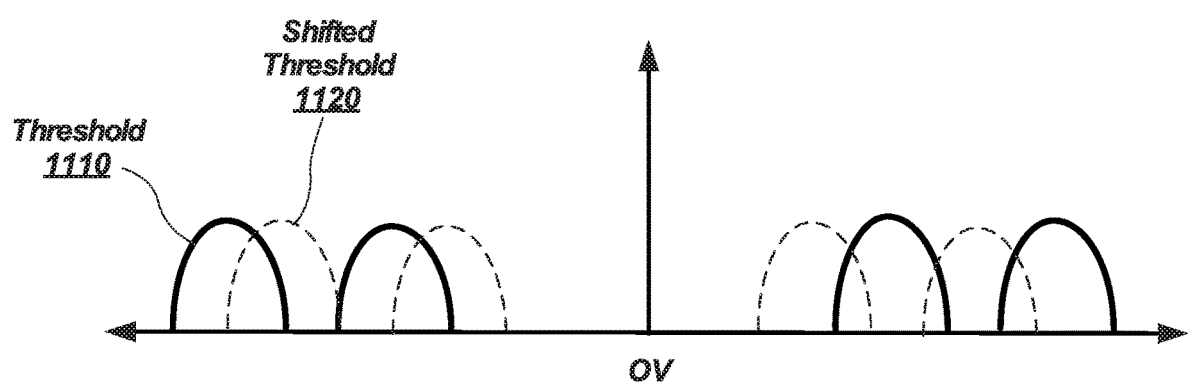
FIG. 11 illustrates a threshold delay effect according to various embodiments of the present disclosure.

FIG. 11 depicts possible distributions of a threshold delay effect. One or more thresholds are depicted by bold lines (e.g., threshold 1110). In response to a single pulse or multiple pulses, the threshold distributions are shifted, as depicted by the dotted lines (e.g., shifted threshold 1120). In various embodiments, the threshold distributions shift toward an origin if measured with long selection times (pre-bias).

A threshold delay effect is a desirable feature in synaptic neurodynamics because synapses are unique to one another, but they also follow the same STDP rule. According to the STDP rule, the bias drift for each synapse should be exponential and return to the original state in 50 time quanta. In various embodiments, each of the pre-synaptic events arriving on word lines post-spike will experience a unique (to their target cells) "snapshot" of the cell I-V curve at the time they arrive. For example, a pre-synaptic signal driven on word line, WL0, may be effected by a "snapshot" of the I-V curve of memory cell 1030 (see FIG. 10), at the time the signal arrives at memory cell 1030. Additionally, immediately upon a pre-synaptic event arrival at a memory cell, an action may be taken to the memory cell conductance to permanently "fix" the I-V curve "snapshot" of the memory cell. In various embodiments, the action to permanently "fix" the I-V curve "snapshot" may be (1) sending refresh pulses, and/or (2) having two memory cells per neuron: one cell (e.g., memory cell 1030) for drifting conductance or I-V curve as described, and another cell (e.g., memory cell 1032; see FIG. 10) for fixing permanent conductance (e.g., a different feature from using different from "threshold delay effect"). Additionally, in various embodiments, when a pre-synaptic event arrives at a memory cell, the analog value of a drifting memory cell is copied to another memory cell. This can be done, for example, by a successive approximation differential-sensing converter (not shown). In some embodiments, the threshold delay effect can be avoided for post-spike arriving pre-synaptic events (LTD). However, the threshold delay effect may be highly desired for LTP.

The following description is directed to managing pre-synaptic events prior to a neuron spike. In view of the STDP rule, as described above, the synaptic conductance (or synaptic weight) of a synapse is adjusted (potentiated) according to the LTP window. It is also noted that a challenge for emulating an LTP is indeterministic post-synaptic spike time, such that the contribution of all pre-synaptic events to the post-synaptic spike is unknown until the actual spike is emitted.

In at least one embodiment, an LTP window is modeled by storing time stamps of pre-synaptic events aligned to each synapse. When a post-synaptic neuron spikes at some time the time stamps are read on word lines. The time delta between the time stamps and a spike time is computed and the weight is adjusted according to the time delta. For example, a pre-synaptic signal (based on a pre-synaptic event) is driven on word line, WL1 at time, T1. Time, T1, is then stored on a memory cell, such as memory cell 1044 (see FIG. 10). At time, T2, a spike (e.g., spike 1060) is generated by integration circuit 1050 that emulates a spike of a neuron. The delta of T2 and T1 is then determined. The conductance (e.g., synaptic weight) of a memory cell (e.g., cell 1042) is then adjusted based on LTP window of the STPD rule. For instance, referring to FIG. 7, the delta of T2 and T1 is determined based on portion 702 of graph 700, where portion 702 indicates the change of conductance as a function of difference between pre-synaptic and post-synaptic spike times.

Moreover, in some embodiments, the threshold delay effect may be used to "fake" or speculate conductance potentiation as if a post-synaptic spike occurred in the time quanta of pre-synaptic event arrival when the change in synaptic conductance is the highest (threshold is reduced to minimum or maximum, depending on implementation). Similar to the LTD case (as described above) the I-V curve will drift back to its original state after about 50 time quanta. However, if a post-synaptic neuron spike arrives during this window an immediate action is taken to the cell conductance to fix the cell conductance permanently at the time of spike and taking into account the I-V curve "snapshot" at that exact time.

In some embodiments, since memory cell conductance is deviated by "faking" or speculating the conductance potentiation, at least two cells per synapse are used (similar to the LTD case described above). For example, a first memory cell (e.g., memory cell 1030) is used for an original conductance state for normal current integration, and a second memory cell (e.g., memory cell 1032) is used for threshold modulation. Both cells include the same conductance at the origin. Thus, any pre-synaptic event arrived within an LTP window may inject current into the first cell and participate in membrane potential disturb, and, at the same time, re-adjust the I-V threshold of the second cell that "fakes" or speculates the conductance potentiation.

Additionally, in some embodiments, both cells have the same conductance at the time of post-synaptic spike. For example, conductance from threshold-modulated cell (e.g., memory cell 1032) is "copied" to the first cell (e.g., memory cell 1030) so that state of the synapse is preserved. Immediately post-spike and after both cells take a "copy" of the same conductance, one of the cells (e.g., memory cell 1032) goes into LTD mode as described above (threshold is increased) and another cell (e.g., memory cell 1030) does current integration. In some embodiments, a single cell may be used for both LTD mode and current integration. In some embodiments, more than two cells are used for implementing LTD mode and current integration.

Alternatively to natural threshold drift, a forced threshold adjustment is used every time quanta (e.g., reduce by 95% every time quanta for cells that received synaptic events). A forced threshold adjustment may be used if a natural threshold drift does not fit one or more requirements for emulating synaptic events. A forced threshold allows for improved control of threshold adjustments and direct use "permanent" threshold. Additionally, a pair of cells may be equalized upon a spike signal from a neuron. Equalization may be done involving a differential amplifier.

Referring to FIG. 10, in one example, bit line, BL0, is used for current integration and bit line, BL1, is used for modulation of a neuron (emulated by sense amplifier 1052). A pre-synaptic event arrives at word line, WL1. Memory cell 1040 permits the WL1 input via its conductance. A bias for memory cell 1042 is adjusted such as if a neuron spiked in the time quanta that the pre-synaptic event arrived. As a result, the threshold of memory cell 1042 is reduced (e.g., bias is adjusted to a maximum) as per the STDP rule. Additionally, the bias of memory cell 1042 is returned to its original state after 50 ms (LTP window). After a few time quanta, a neuron (e.g., sense amplifier 1052) integrates enough charge on a bit line (e.g., BL0) and generates a spike (e.g., spike 1060). As a result, spike 1060 is reflected back to both bit lines for threshold modulation. Thus, a post-spike pre-synaptic event arriving on word line, WL0, participates in charge integration (on one of the bit lines) and depresses memory cells 1030 and 1040.

Figure 12:
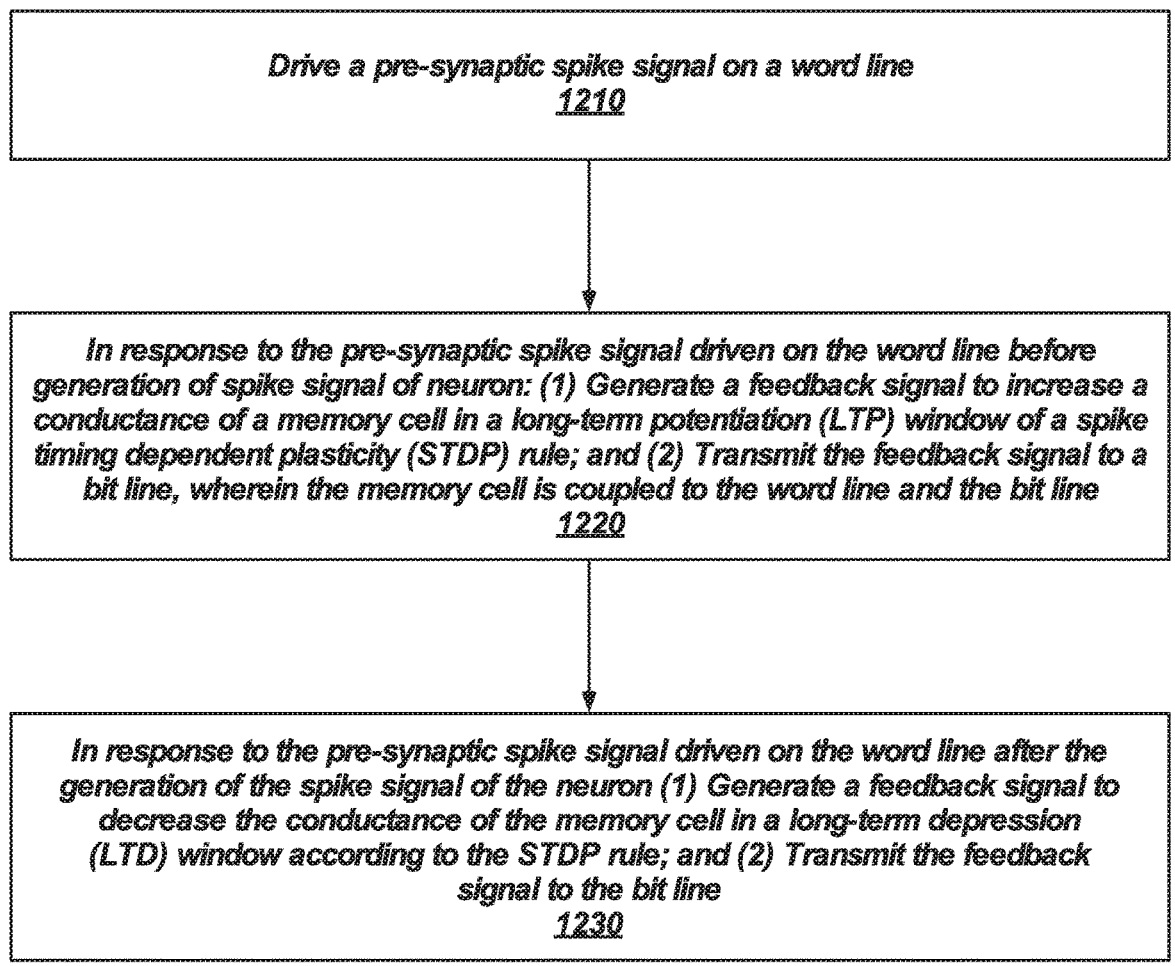
FIG. 12 is a flowchart of yet another example method of processing-in-memory spiking events, in accordance with various embodiments of the present disclosure.

FIG. 12 is a flowchart of a method 1200 of adjusting synaptic weight of a synapse, in accordance with various embodiments of the disclosure. Method 1200 may be arranged in accordance with at least one embodiment described in the present disclosure. Method 1200 may be performed, in some embodiments, by a device or system, such as system 100 of FIG. 1, system 600 of FIG. 6, system 1000 of FIG. 10 or another device or system. Although illustrated as discrete blocks, various blocks may be divided into additional blocks, combined into fewer blocks, or eliminated, depending on the desired implementation.

At block 1210 of method 1200, a pre-synaptic spike signal is driven on a word line. For example, driver 1020 drives a signal on a word line of memory array 1010. The signal driven on the word line emulates a pre-synaptic signal received by a neuron.

At block 1220, in response to the pre-synaptic spike signal driven on the word line before generation of a spike signal by a neuron: (1) a feedback signal is generated to increase a conductance of a memory cell in a long-term potentiation (LTP) window of a spike timing dependent plasticity (STDP) rule, and (2) the feedback signal is transmitted to a bit line. For example, in response to the a pre-synaptic spike signal drive on word line, WL1, by driver 1020 and before generation of spike 1060 by sense amplifier 1052, a feedback signal (e.g., feedback 1055 and/or feedback 1057) is generated to increase the conductance of one or more memory cells coupled to word line, WL1. In particular, the feedback signal is transmitted to word line, WL1.

At block 1230, in response to the pre-synaptic spike signal driven on the word line after generation of a spike signal of a neuron: (1) a feedback signal is generated to decrease a conductance of a memory cell in a long-term potentiation (LTP) window of a spike timing dependent plasticity (STDP) rule, and (2) the feedback signal is transmitted to a bit line. For example, in response to the pre-synaptic spike signal drive on word line, WL1, by driver 1020 and after generation of spike 1060 by sense amplifier 1052, a feedback signal (e.g., feedback 1055 and/or feedback 1057) is generated to decrease the conductance of one or more memory cells coupled to word line, WL1. In particular, the feedback signal is transmitted to word line, WL1.

Modifications, additions, or omissions may be made to method 1200 without departing from the scope of the present disclosure. For example, the operations of method 1200 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 13:
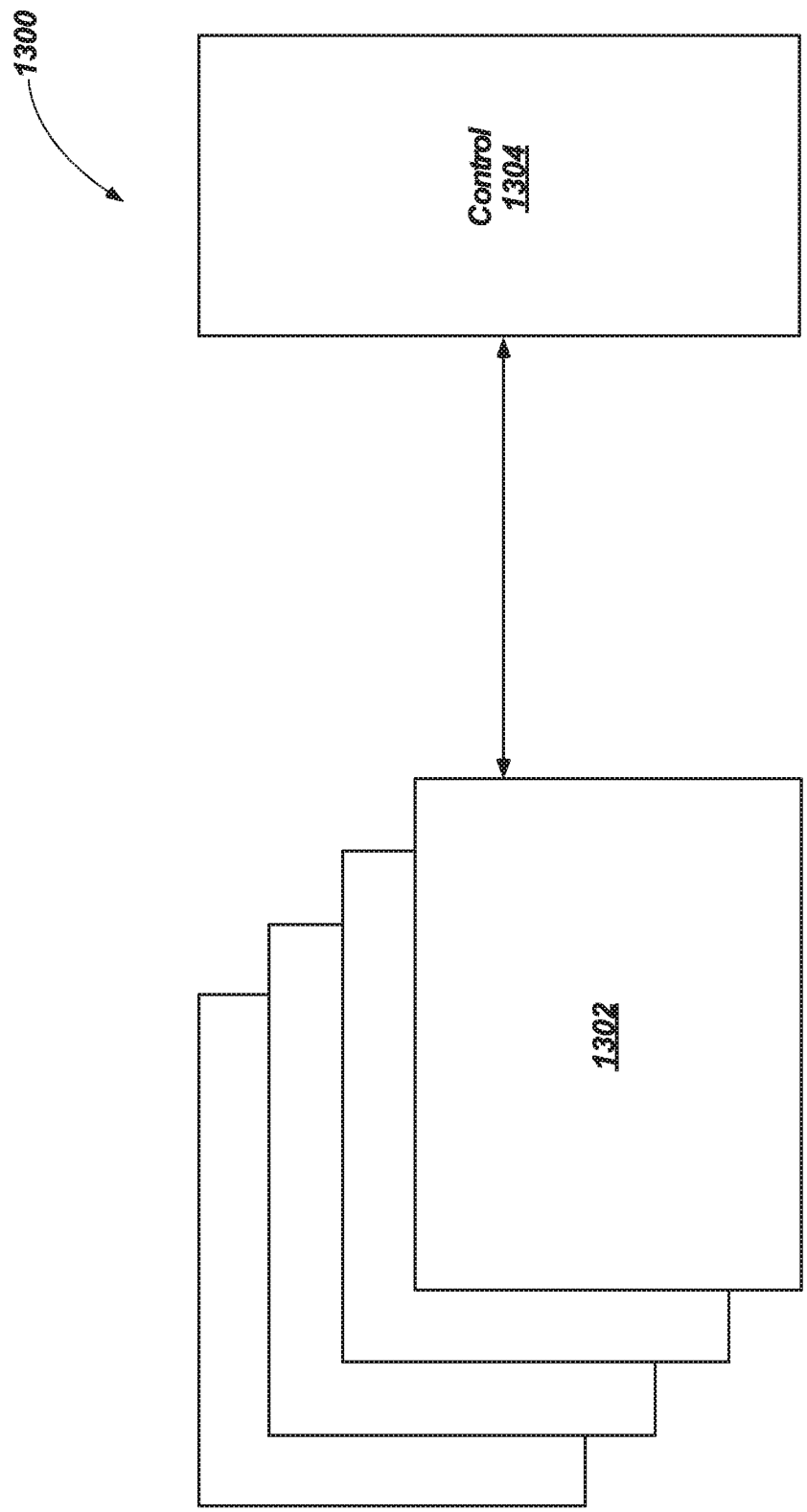
FIG. 13 is a simplified block diagram of an example memory system implemented according to one or more embodiments described herein.

FIG. 13 is a simplified block diagram of a memory system 1300 implemented according to one or more embodiments described herein. Memory system 1300 includes a memory module including a number of memory devices 1302 and a control logic component 1304. For example, memory devices 1302 may include memory device 120 and/or memory array 130 of FIG. 1, and/or memory block 310 of FIG. 3 and/or memory array 640 of FIG. 6, and/or memory array 1010 of FIG. 10, and control logic component 1304 may include controller 140 and/or host 111 of FIG. 1. Control logic component 1304 may be operatively coupled with the memory devices 1302 so as to read, write, or re-fresh any or all memory cells within memory devices 1302.

Figure 14:
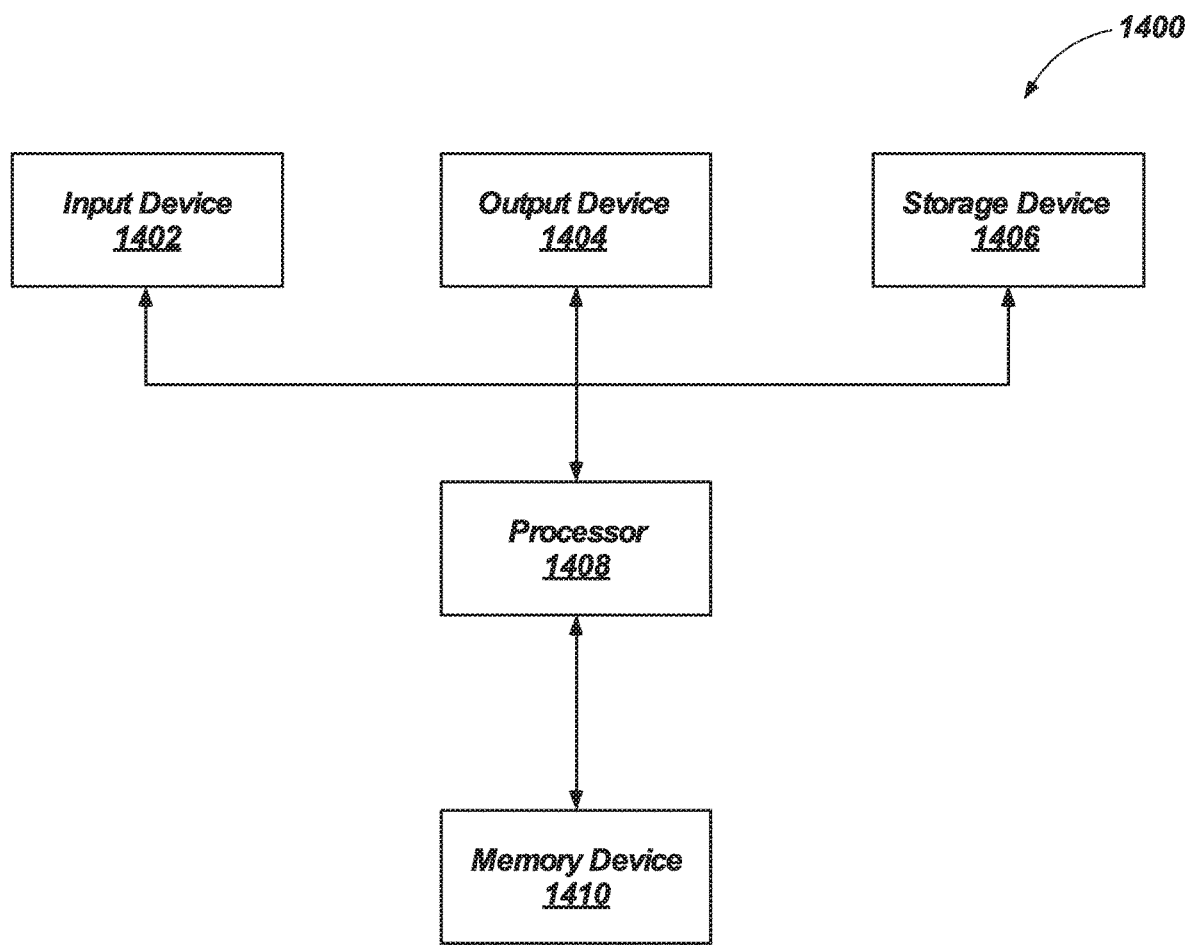
FIG. 14 is a simplified block diagram of an example electronic system implemented according to one or more embodiments described herein.

An electronic system is also disclosed. The electronic system may include memory system including a number of memory devices. FIG. 14 is a simplified block diagram of an electronic system 1400 implemented according to one or more embodiments described herein. Electronic system 1400 includes at least one input device 1402. Input device 1402 may be a keyboard, a mouse, or a touch screen. Electronic system 1400 further includes at least one output device 1404. Output device 1404 may be a monitor, touch screen, or speaker. Input device 1402 and output device 1404 are not necessarily separable from one another. Electronic system 1400 further includes a storage device 1406. Input device 1402, output device 1404, and storage device 1406 are coupled to a processor 1408.

Electronic system 1400 further includes a memory device 1410 coupled to processor 1408. Memory device 1410 may include and/or may be part of a memory device (e.g., memory device 120 of FIG. 1) and/or may be part of a memory system, such as memory system 1300 of FIG. 13, and/or another system. Electronic system 1400 may include a computing, processing, industrial, or consumer product. For example, without limitation, electronic system 1400 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

According to various embodiments disclosed herein, and in contrast to some conventional devices, systems, and methods, data used in one or more PIM computations may be used to perform SNN spiking events. As a result, a number of reads from and/or writes to one or more memory arrays may be reduced, which may improve efficiency and/or speed of PIM operations and/or reduce latency associated with PIM operations.

One or more embodiments of the present disclosure include a system. For example, a system may include a memory array comprising a number of memory cells at an intersection of a number of word lines and a number bit lines, wherein data written to the number of memory cells corresponds to synaptic weights values. The system may include a driver configured to drive the number of word lines. The system may also include circuitry comprising a sense amplifier coupled to the number of bit lines. The circuitry is configured to receive output signals from the number of bit lines. The circuitry is further configured to, in response to a first signal driven on a word line before generation of a spike signal of a neuron, generate a second signal with a voltage, current, or timing characteristic, or combination thereof that increases a conductance of a first memory cell of the number of memory cells according to a spike timing dependent plasticity (STDP) characteristic of the first memory cell. The circuitry is further configured to, in response to the first signal driven on the word line after the generation of the spike signal of the neuron, generate a third signal with a different voltage, current, or timing characteristic, or combination thereof that decreases the conductance of the first memory cell according to the STDP characteristic.

According to another embodiment, a method includes driving a first signal on a word line. The method further includes in response to the first signal driven on the word line before generation of a spike signal of a neuron, generating a second signal with a voltage, current, or timing characteristic, or combination thereof that increases a conductance of a memory cell in a long-term potentiation (LTP) window of a spike timing dependent plasticity (STDP) characteristic, and transmitting the second signal to a bit line, wherein the memory cell is coupled to the word line and the bit line. The method also includes in response to the first signal driven on the word line after the generation of the spike signal of the neuron, generating a third signal with a different voltage, current, or timing characteristic, or combination thereof that decreases the conductance of the memory cell in a long-term depression (LTD) window according to the STDP characteristic, and transmitting the third signal to the bit line.

In yet another embodiment, an electronic system includes at least one input device, at least one output device, at least one processor device operably coupled to the input device and the output device, and at least one memory device operably coupled to the at least one processor device. The memory device comprises a memory array comprising a number of memory cells at an intersection of a number of word lines and a number bit lines, wherein data written to the number of memory cells correspond to synaptic weight values, and circuitry comprising a sense amplifier coupled to the number of bit lines. The circuitry is configured to in response to a first signal driven on a word line before generation of a spike signal of a neuron, generate second signal with a voltage, current, or timing characteristic, or combination thereof that increases a conductance of a memory cell of the number of memory cells, and in response to the first signal driven on the word line after the generation of the spike signal of the neuron, generate a third signal with a different voltage, current, or timing characteristic, or combination thereof that decreases a conductance of the memory cell.

According to a further embodiment, an electronic system comprises at least one input device, at least one output device, at least one processor device operably coupled to the input device and the output device and at least one memory device operably coupled to the at least one processor device. The at least one memory device comprises a memory cell array comprising a number of resistive elements configured to store synaptic weights, a driver configured to drive spiking events over a number of word lines coupled to the number of resistive elements at each time quanta of a series of time quanta of a SNN, and an integration circuit configured to integrate output voltage of bit lines coupled to the resistive elements.

According to another embodiment, a system comprising a memory array comprising a number of memory cells, wherein conductance values of the number of memory cells correspond to synaptic weights values. The system further comprising circuitry coupled to the memory array. The circuitry configured to receive output signals from the memory array, and in response to a first signal received at the memory array, generate a second signal to increase or decrease conductance of a memory cell of the number of memory cells according to a spike timing dependent plasticity (STDP) rule.

According to a further embodiment, an electronic system comprising at least one input device, at least one output device, at least one processor device operably coupled to the input device and the output device and at least one memory device operably coupled to the at least one processor device. The at least one memory device comprising a memory array comprising a number of memory elements and circuitry comprising one or more sense amplifiers coupled to memory array. The circuitry configured to in response to receiving output signals from the memory array indicative of a first signal arriving at the memory array before generation of a spike signal of a neuron, generate a second signal to decrease the resistance of one or more memory elements of the number of memory elements. The circuitry further configured to in response to receiving output signals from the memory array indicative of the first signal arriving at the memory array after generation of a spike signal of a neuron, generate a third signal to increase the resistance of the one or memory elements of the number of memory elements.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absent a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A system, comprising:
   a memory array comprising a number of memory cells at intersections of a number of word lines and a number of bit lines, wherein data written to the number of memory cells corresponds to synaptic weights values;
   a driver configured to drive the number of word lines; and
   circuitry comprising a sense amplifier coupled to the number of bit lines and configured to generate a spike signal of a neuron, the circuitry configured to:
      receive output signals from the number of bit lines;
      in response to a first signal driven on a word line of the number of word lines before generation of the spike signal of the neuron, generate a second signal with a voltage, current, or timing characteristic, or combination thereof that increases a conductance of a first memory cell of the number of memory cells according to a spike timing dependent plasticity (STDP) characteristic of the first memory cell;
      in response to the first signal driven on the word line after the generation of the spike signal of the neuron, generate a third signal with a different voltage, current, or timing characteristic, or combination thereof that decreases the conductance of the first memory cell according to the STDP characteristic; and
      in response to the first signal driven on the word line:
         integrate current on a first bit line of the number of bit lines intersecting—
         enable threshold modulation on a second bit line of the number of bit lines intersecting the word line.

2. The system of claim 1, wherein the circuitry is further configured to, in response to the generation of the spike signal of the neuron, transmit a feedback signal to a bit line of the number of bit lines, wherein the feedback signal is a decaying bias.

3. The system of claim 2, wherein the second signal is applied to each of the number of memory cells on the bit line.

4. The system of claim 2, wherein the circuitry is further configured to, in response to a fourth signal driven on the word line after the generation of the spike signal of the neuron and during the decaying bias, adjust a conductance value of the first memory cell according to the decaying bias.

5. The system of claim 1, wherein the circuitry is further configured to, in response to the generation of the spike signal of the neuron, apply a threshold modulating bias to a bit line of the number of bit lines.

6. The system of claim 5, wherein the threshold modulating bias is applied immediately after the generation of the spike signal.

7. The system of claim 1, wherein the circuitry is further configured to, in response to the first signal driven on the word line after the generation of the spike signal of the neuron, apply an individual decaying bias to each memory cell of the number of memory cells on a bit line of the number of bit lines.

8. The system of claim 1, wherein the circuitry is further configured to, in response to the generation of the spike signal of the neuron, apply a decaying feedback signal to each memory cell on a bit line of the number of bit lines, wherein the decaying feedback signal emulates a decaying long-term depression (LTD) window.

9. The system of claim 1, wherein the circuitry is further configured to, in response to the first signal driven on the word line before the generation of the spike signal of the neuron, apply another signal to one or more memory cells of the number of memory cells on the word line, wherein a conductance of the one or more memory cells returns to an original conductance state after a predetermined time duration.

10. The system of claim 1, wherein a time stamp of the first signal is stored in one or more of the number of memory cells in the memory array.

11. The system of claim 1, wherein the circuitry is further configured to, in response to the first signal driven on the word line:
inject current on a second memory cell of the number of memory cells on a first bit line of the number of bit lines intersecting the word line; and
adjust threshold bias on a third memory cell of the number of memory cells on a second bit line of the number of bit lines intersecting the word line.

12. The system of claim 1, further comprising a memory controller configured to, during a long-term potentiation LTP window and in response the generation of the spike signal of the neuron, copy conductance on a second memory cell of the number of memory cells on a second bit line of the number of bit lines intersecting the word line to the first memory cell on a first bit line of the number of bit lines intersecting the word line.

13. The system of claim 1, wherein the circuitry is further configured to integrate conductance of memory cells on a bit line of the number of bit lines.

14. The system of claim 1, wherein the circuitry is further configured to, in response to a membrane potential of the neuron meeting a predetermined threshold based at least in part on the output signals, generate the spike signal.

15. A method, comprising:
driving a first signal on a word line;
in response to the first signal driven on the word line before generation of a spike signal of a neuron:
generating, via circuitry configured to generate the spike signal, a second signal with a voltage, current, or timing characteristic, or combination thereof that increases a conductance of a memory cell in a long-term potentiation (LTP) window of a spike timing dependent plasticity (STDP) characteristic; and
transmitting the second signal to a bit line in response to the generation of a spike signal of a neuron, wherein the memory cell is coupled to the word line and the bit line;
in response to the first signal driven on the word line after the generation of the spike signal of the neuron:
generating, via the circuitry configured to generate the spike signal, a third signal with a different voltage, current, or timing characteristic, or combination thereof that decreases the conductance of the memory cell in a long-term depression (LTD) window according to the STDP characteristic; and
transmitting the third signal to the bit line; and
in response to the generation of the spike signal of the neuron driven on the bit line, transmit a feedback signal from the circuitry to each of a plurality of memory cells on the bit line, wherein the feedback signal is a decaying bias.

16. The method of claim 15, further comprising, in response to the first signal driven on the word line before generation of spike signal of neuron, generating a decaying signal to change conductivity of the memory cell in a decaying manner.

17. The method of claim 16, further comprising, in response to the generation of the spike signal of the neuron and during a decaying signal, adjusting a conductance value of the memory cell according to the decaying signal, the conductivity of the memory cell, or both.

18. The method of claim 15, further comprising, in response to the first signal driven on the word line before the generation of the spike signal of the neuron:
applying a current to a first memory cell on first bit line intersecting the word line; and
adjusting a threshold bias on a second memory cell on a second bit line intersecting the word line.

19. An electronic system, comprising:
at least one input device;
at least one output device;
at least one processor device operably coupled to the input device and the output device; and
at least one memory device operably coupled to the at least one processor device and comprising:
a memory array comprising a number of memory cells at intersections of a number of word lines and a number of bit lines, wherein data written to the number of memory cells correspond to synaptic weight values;
circuitry comprising a sense amplifier coupled to the number of bit lines and configured to generate a spike signal of a neuron, the circuitry configured to:
generate, in response to a first signal driven on a word line of the number of word lines before generation of the spike signal of the neuron, a second signal with a voltage, current, or timing characteristic, or combination thereof that increases a conductance of a memory cell of the number of memory cells;
generate, in response to the first signal driven on the word line after the generation of the spike signal of the neuron, a third signal with a different voltage, current, or timing characteristic, or combination thereof that decreases a conductance of the memory cell; and
in response to the generation of the spike signal of the neuron driven on a bit line of the number of bit lines, transmit a feedback signal from the sense amplifier to each of a plurality of memory cells on the bit line, wherein the feedback signal is a decaying bias.

20. The electronic system of claim 19, further comprising a memory controller configured to, during a long-term potentiation (LTP) window and in response the generation of the spike signal of the neuron, copy a conductance on a second memory cell of the number of memory cells on a second bit line of the number of bit lines intersecting the word line to a first memory cell of the number of memory cells on a first bit line of the number of bit lines intersecting the word line.

21. The electronic system of claim 19, wherein the circuitry is further configured to integrate conductance of memory cells on the bit line.

22. The electronic system of claim 19, wherein the circuitry is further configured to, in response to a membrane potential of the neuron meeting a predetermined membrane potential threshold, generate the spike signal.

* * * * *